United States Patent
Jeon et al.

(10) Patent No.: US 12,266,609 B2
(45) Date of Patent: Apr. 1, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Hyung Jun Jeon, Seoul (KR); Kwang Jin Moon, Hwaseong-si (KR); Son-Kwan Hwang, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 372 days.

(21) Appl. No.: 17/680,808

(22) Filed: Feb. 25, 2022

(65) Prior Publication Data
US 2022/0367364 A1    Nov. 17, 2022

(30) Foreign Application Priority Data
May 11, 2021  (KR) .................. 10-2021-0060433

(51) Int. Cl.
*H01L 23/538* (2006.01)
*H01L 25/065* (2023.01)

(52) U.S. Cl.
CPC ...... *H01L 23/5383* (2013.01); *H01L 23/5386* (2013.01); *H01L 25/0657* (2013.01)

(58) Field of Classification Search
CPC .................................................. H01L 25/0652
See application file for complete search history.

(56) References Cited

U.S. PATENT DOCUMENTS

| | | | |
|---|---|---|---|
| 10,204,893 B2 | 2/2019 | Uzoh et al. | |
| 10,522,514 B2 | 12/2019 | Wu et al. | |
| 10,685,935 B2 | 6/2020 | Chen et al. | |
| 10,784,247 B2 | 9/2020 | Chen et al. | |
| 10,797,001 B2 | 10/2020 | Chen et al. | |
| 2015/0287697 A1* | 10/2015 | Tsai ........................ | H01L 24/97 257/773 |
| 2020/0006309 A1 | 1/2020 | Chen et al. | |
| 2020/0381397 A1 | 12/2020 | Yu et al. | |
| 2020/0411472 A1 | 12/2020 | Chung et al. | |

\* cited by examiner

Primary Examiner — Matthew L Reames
(74) Attorney, Agent, or Firm — Fish & Richardson P.C.

(57) ABSTRACT

A semiconductor package includes a first semiconductor chip, which includes a first semiconductor substrate and a first bonding layer on the first semiconductor substrate. A second semiconductor chip includes a second semiconductor substrate, a second bonding layer bonded to the first bonding layer, and a chip-through-via which penetrates the second semiconductor substrate and is connected to the second bonding layer. A passivation film extends along an upper side of the second semiconductor chip and does not extend along side-faces of the second semiconductor chip. The chip-through-via penetrates the passivation film. A multiple-gap-fill film extends along the upper side of the first semiconductor chip, the side faces of the second semiconductor chip, and the side faces of the passivation film. The multiple-gap-fill films includes an inorganic filling film and an organic filling film which are sequentially stacked on the first semiconductor chip.

19 Claims, 23 Drawing Sheets

SEMICONDUCTOR DEVICE AND METHOD FOR FABRICATING THE SAME

CROSS-REFERENCE TO RELATED APPLICATION

This application claims priority from Korean Patent Application No. 10-2021-0060433 filed on May 11, 2021, in the Korean Intellectual Property Office and all the benefits accruing therefrom under 35 U.S.C. 119, the contents of which in its entirety are herein incorporated by reference.

BACKGROUND

1. Field of the Disclosure

The present disclosure relates to a semiconductor package and a method for fabricating the same. More specifically, the present disclosure relates to a semiconductor package including different types of semiconductor chips from each other and a method for fabricating the same.

2. Description of the Related Art

With rapid development of an electronic industry and demands of users, electronic devices become smaller, lighter, and more multifunctional and semiconductor packages used in the electrical devices are also required to be smaller, lighter, and more multifunctional. To this end, by integrating two or more types of semiconductor chips into a single semiconductor package, it has been possible to increase the capacity and multifunction of the semiconductor package, while significantly reducing the size of the semiconductor package.

On the other hand, in order to achieve a high capacity of the semiconductor package, it is necessary to stack the semiconductor chips. A method of stacking the semiconductor chips may be broadly classified into a C2C (chip to chip) method, a C2W (chip to wafer) method, and a W2W (wafer to wafer) method. The C2C method is a method of stacking in chip units, and the W2W method is a method of fabricating a chip through a dicing process after stacking in wafer units. The C2W method has characteristics of an intermediate stage between the C2C method and the W2W method.

SUMMARY

Aspects of the present disclosure provide a semiconductor package having improved process stability.

Aspects of the present disclosure also provide a method for fabricating a semiconductor package having improved process stability.

According to some aspects of the present disclosure, there is provided a semiconductor package having a first semiconductor chip which includes a first semiconductor substrate and a first bonding layer on the first semiconductor substrate. A second semiconductor chip includes a second semiconductor substrate, a second bonding layer bonded to the first bonding layer on the second semiconductor substrate, and a chip through via which penetrates the second semiconductor substrate and is connected to the second bonding layer. A passivation film extends along an upper side of the second semiconductor chip and does not extend along side faces of the second semiconductor chip. The chip through via penetrates the passivation film. A multiple gap fill film extends along the upper side of the first semiconductor chip, the side faces of the second semiconductor chip, and the side faces of the passivation film. The multiple gap fill film includes an inorganic filling film and an organic filling film which are sequentially stacked on the first semiconductor chip.

According to some aspects of the present disclosure, there is provided a semiconductor package comprising a first semiconductor chip which includes a first semiconductor substrate and a first semiconductor element layer on a front side of the first semiconductor substrate. A second semiconductor chip includes a second semiconductor substrate, a second semiconductor element layer on a front side of the second semiconductor substrate opposite to the front side of the first semiconductor substrate, and a chip through via which penetrates the second semiconductor substrate and the second semiconductor element layer. A passivation film extends along an upper side of the second semiconductor chip. The chip through via penetrates the passivation film. A liner film extends along the upper side of the first semiconductor chip and the side faces of the second semiconductor chip. A multiple gap fill film includes an inorganic filling film and an organic filling film which are sequentially stacked on the liner film. An upper side of the passivation film, an upper side of the liner film, and an upper side of the multiple gap fill film are placed on the same plane.

According to some aspects of the present disclosure, there is provided a semiconductor package comprising a first semiconductor chip which includes a first semiconductor substrate and a first bonding layer on the first semiconductor substrate. A second semiconductor chip and a third semiconductor chip are each stacked on the first semiconductor chip and spaced apart from each other. A passivation film extends along upper sides of each of the second semiconductor chip and the third semiconductor chip. A multiple gap fill film fills a region between the second semiconductor chip and the third semiconductor chip on the first semiconductor chip. A redistribution stack extends along an upper side of the passivation film and an upper side of the multiple gap fill film. Each of the second semiconductor chip and the third semiconductor chip includes a second semiconductor substrate, a second bonding layer bonded to the first bonding layer on the second semiconductor substrate, and a chip through via which penetrates the second semiconductor substrate and connects the second bonding layer and the redistribution stack. The multiple gap fill film includes an inorganic filling film and an organic filling film which are sequentially stacked on the first semiconductor chip. Heights of the upper sides of each of the second semiconductor chip and the third semiconductor chip are lower than a height of the upper side of the multiple gap fill film from the upper side of the first semiconductor chip.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
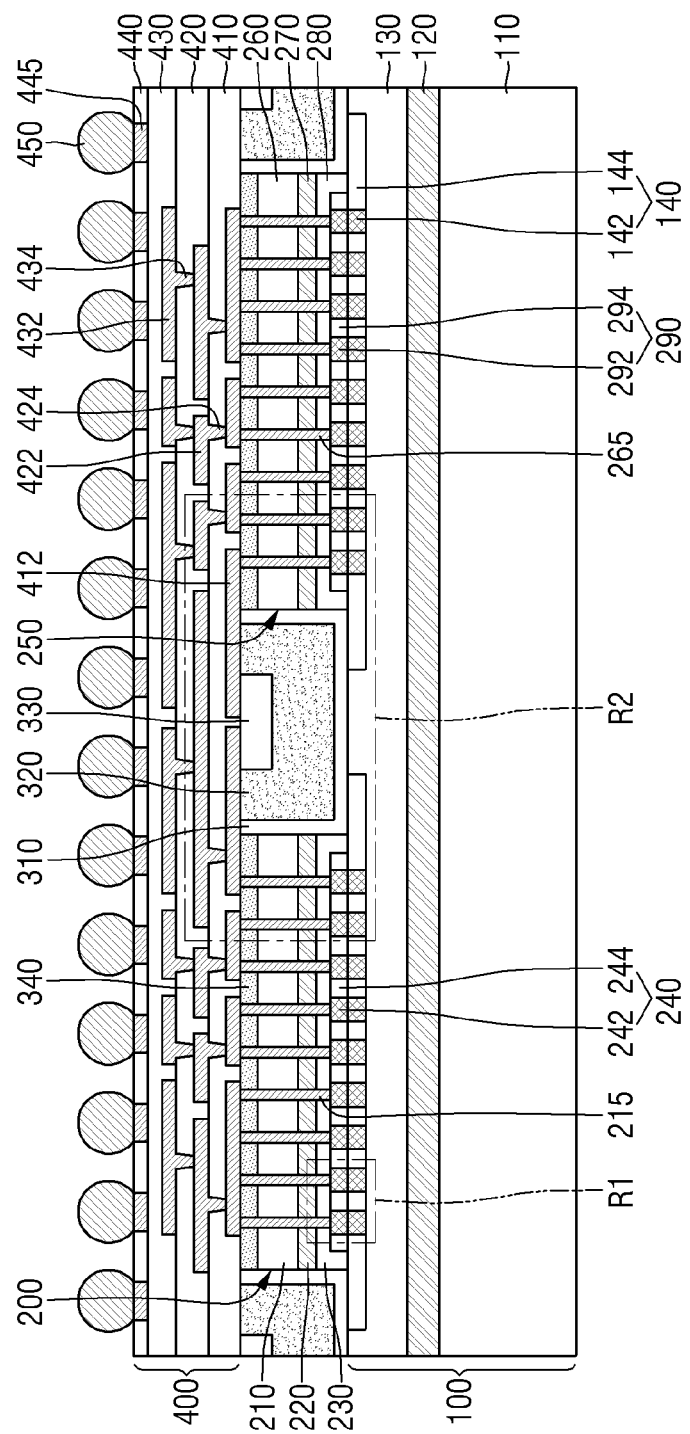
FIG. 1 is a schematic cross-sectional view for explaining a semiconductor package according to some embodiments.

Hereinafter, a semiconductor package according to the exemplary embodiments will be described referring to FIGS. 1 to 9.

Although a FOWLP (Fan-Out Wafer Level Package) type semiconductor package is shown as an example in the drawings relating to the semiconductor package according to the exemplary embodiments, the technical idea of the present disclosure is not limited thereto. For example, the semiconductor package according to other exemplary embodiments may, of course, be another type of semiconductor package that is made up of a redistribution structure such as a FIWLP (Fan-In Wafer Lever Package) type semiconductor package and a FOPLP (Fan-Out Panel Level Package) type semiconductor package.

Figure 2A:
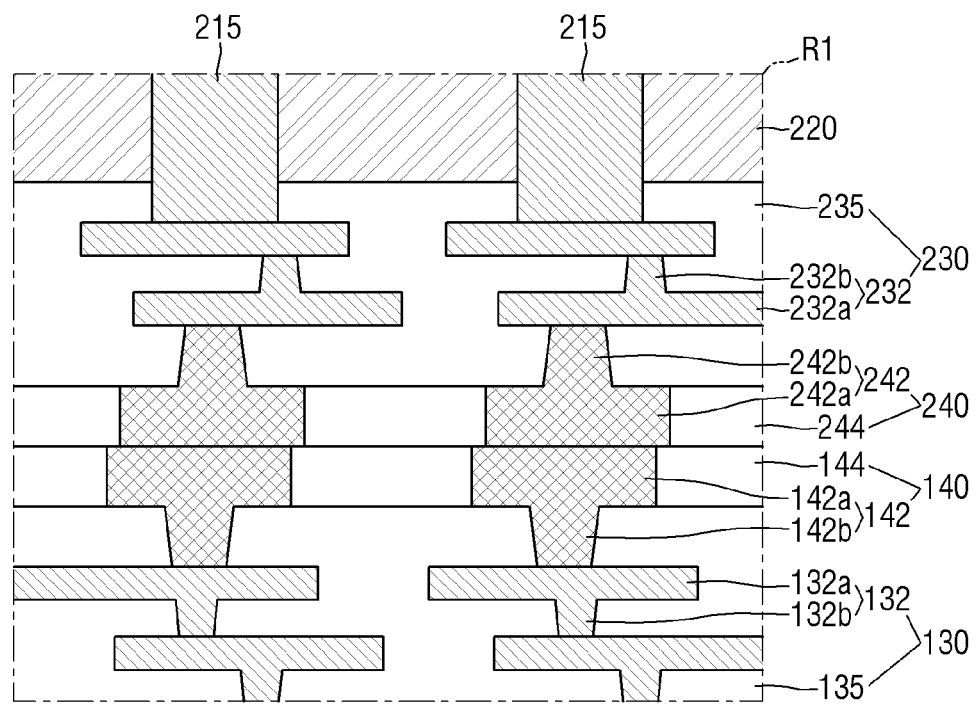
FIGS. 2A to 2C are various enlarged views for explaining a region R1 of FIG. 1.
Figure 2B:
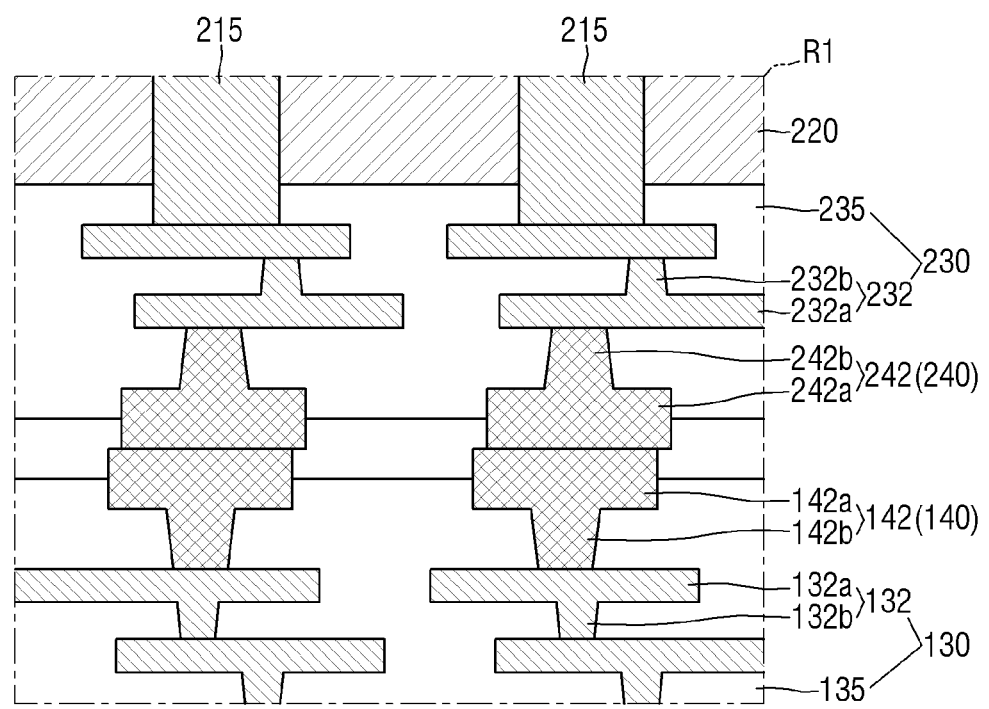
Figure 2C:
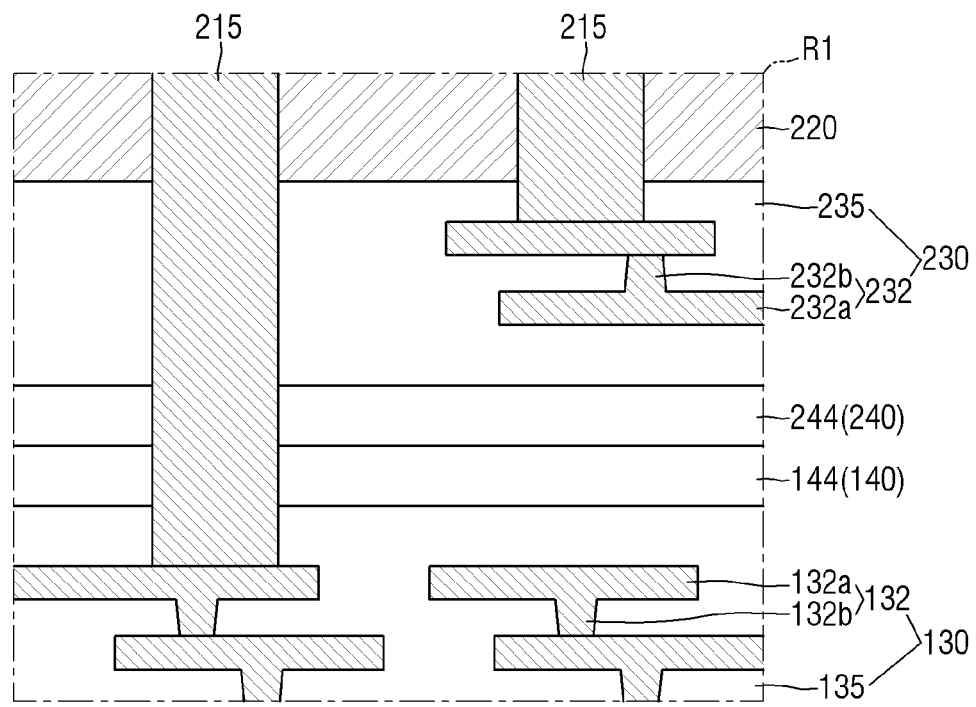
Figure 3:
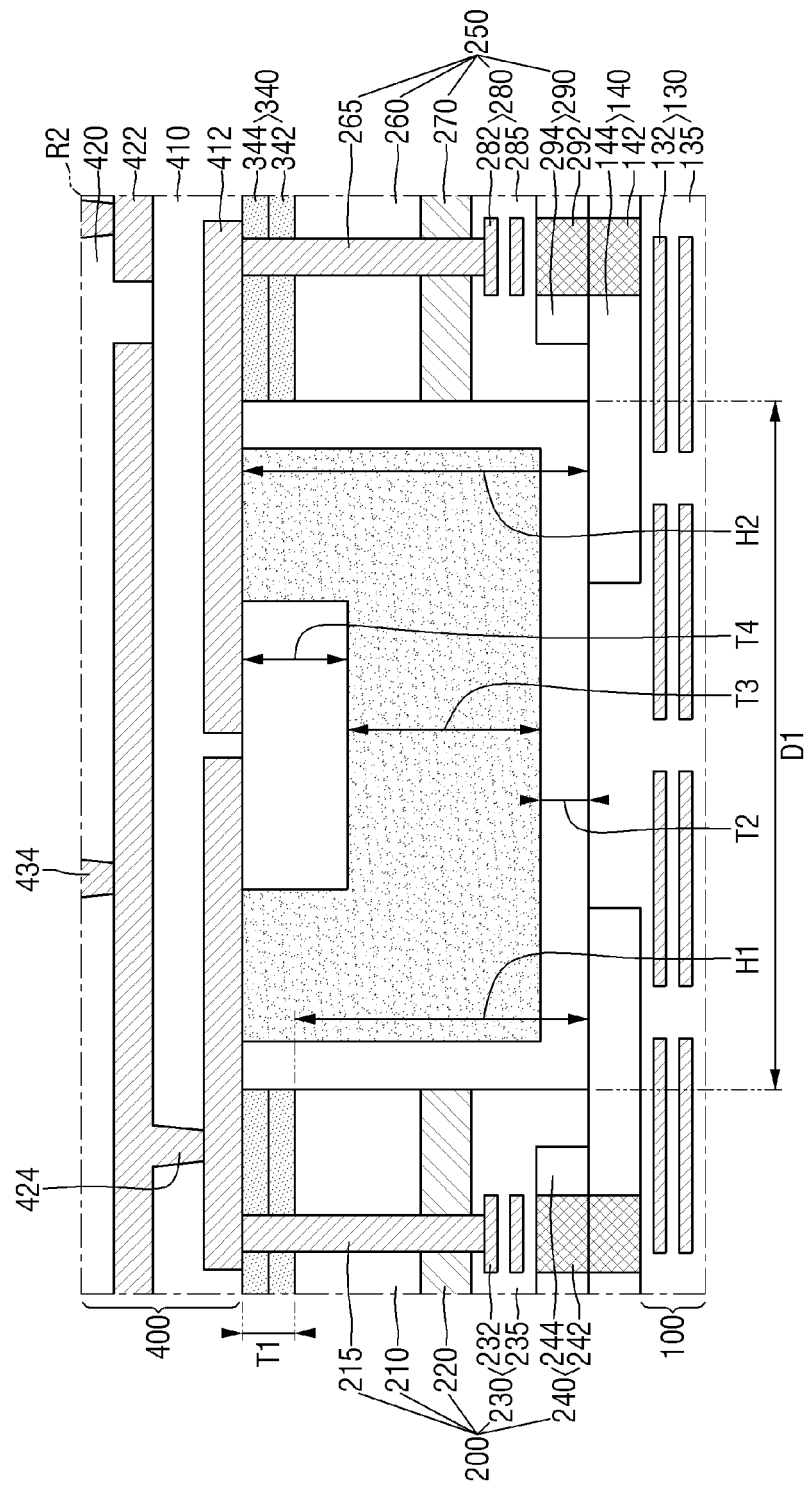
FIG. 3 is an enlarged view for explaining a region R2 of FIG. 1.

FIG. 1 is a schematic cross-sectional view for explaining a semiconductor package according to some embodiments. FIGS. 2A to 2C are various enlarged views for explaining a region R1 of FIG. 1. FIG. 3 is an enlarged view for explaining a region R2 of FIG. 1.

Referring to FIGS. 1 to 3, a semiconductor package according to some embodiments includes a first semiconductor chip 100, a second semiconductor chip 200, a third semiconductor chip 250, a passivation film 340, a liner film 310, multiple gap fill films 320 and 330, a redistribution stack 400, and a plurality of first connection bumps 450.

The first semiconductor chip 100 may include a first semiconductor substrate 110, a first semiconductor element layer 120, a first chip wiring layer 130, and a first bonding layer 140. The first semiconductor substrate 110 may include a front side and a back side that are opposite to each other. The front side of the first semiconductor substrate 110 may be an active side on which the first semiconductor element layer 120 is formed.

The first semiconductor substrate 110 may be, for example, bulk silicon or SOI (silicon-on-insulator). The first semiconductor substrate 110 may be a silicon substrate or may include other substances, for example, silicon germanium, indium antimonide, lead tellurium compounds, indium arsenic, indium phosphide, gallium arsenide or gallium antimonide. Alternatively, the first semiconductor substrate 110 may have an epitaxial layer formed on a base substrate.

The first semiconductor element layer 120 may be placed on the front side of the first semiconductor substrate 110 (for example, an upper side of the first semiconductor substrate 110). The first semiconductor element layer 120 may include various microelectronic elements, for example, MOSFET (metal-oxide-semiconductor field effect transistor) such as a CMOS transistor (complementary metal-insulator-semiconductor transistor), a system LSI (large scale integration), a flash memory, a DRAM, an SRAM, an EEPROM, a PRAM, an MRAM, a RERAM, or an image sensor such as CIS (CMOS imaging sensor), an MEMS (micro-electro-mechanical system), an active element, a passive element, and the like.

The first chip wiring layer 130 may cover the first semiconductor element layer 120. The first chip wiring layer 130 may be electrically connected to the first semiconductor element layer 120. For example, as shown in FIGS. 2A to 3, the first chip wiring layer 130 may include a first inter-chip wiring insulating film 135 that covers the first semiconductor element layer 120 and a first chip wiring structure 132 in the first inter-chip wiring insulating film 135. The first chip wiring structure 132 may include first chip wiring patterns 132a of a multi-layer structure and first chip via plugs 132b that interconnect the first chip wiring patterns 132a. The first semiconductor element layer 120 may be electrically connected to the first chip wiring structure 132. In FIGS. 2A to 3, the arrangement, the number of layers, and the number of the first chip wiring structures 132 are only exemplary and are not limited thereto.

The first chip wiring structure 132 may include, for example, a conductive film, and a barrier film interposed between the conductive film and the first inter-chip wiring insulating film 135. The conductive film of the first chip wiring structure 132 may include, but is not limited to, for example, at least one of tungsten (W), aluminum (Al), and copper (Cu). The barrier film of the first chip wiring structure 132 may include, but is not limited to, for example, at least one of titanium (Ti), titanium nitride (TiN), tantalum (Ta), and tantalum nitride (TaN).

The first bonding layer 140 may be placed on the first chip wiring layer 130. The first bonding layer 140 may cover at least a part of the upper side of the first chip wiring layer 130. The first bonding layer 140 may be electrically connected to the first chip wiring layer 130. For example, the first bonding layer 140 may include a first bonding insulating film 144 that covers the first inter-chip wiring insulating film 135 and a first bonding metal pattern 142 in the first bonding insulating film 144. The first bonding metal pattern 142 may be connected to, for example, the first chip wiring pattern 132a at the top of the first chip wiring structure 132. Accordingly, the first bonding layer 140 may be electrically connected to the first semiconductor element layer 120.

In some embodiments, the first bonding metal pattern 142 may include a first bonding pad 142a and a first bonding via plug 142b. The first bonding pad 142a may be exposed from the first bonding insulating film 144. The first bonding via plug 142b may electrically connect the first bonding pad 142a and the first chip wiring structure 132.

The first bonding metal pattern 142 may include, but is not limited to, metals, for example, copper (Cu), aluminum (Al) or tungsten (W). The first bonding insulating film 144 may include, but is not limited to, oxide (silicon oxide) or polymer.

In some embodiments, the first semiconductor chip 100 may be individual semiconductor chips divided from a wafer by a dicing process.

The second semiconductor chip 200 and the third semiconductor chip 250 may be stacked on the first semiconductor chip 100, respectively. In some embodiments, the second semiconductor chip 200 and the third semiconductor chip 250 may be stacked on the first semiconductor chip 100 by the C2W (chip to wafer; or D2W (die to wafer)) method, respectively.

The second semiconductor chip 200 and the third semiconductor chip 250 may be placed on the first semiconductor chip 100 to be spaced apart from each other at a predetermined distance. A spaced distance D1 between the second semiconductor chip 200 and the third semiconductor chip 250 may be, for example, about 10 μm to about 500 μm. Preferably, the spaced distance D1 between the second semiconductor chip 200 and the third semiconductor chip 250 may be about 50 μm to about 200 μm.

The second semiconductor chip 200 and the third semiconductor chip 250 may each include second semiconductor substrates 210 and 260, second semiconductor element layers 220 and 270, second chip wiring layers 230 and 280, and second bonding layers 240 and 290. The second semiconductor substrates 210 and 260 may include a front side and a back side that are opposite to each other. The front sides of the second semiconductor substrates 210 and 260 may be an active side on which the second semiconductor element layers 220 and 270 are formed. In some embodiments, the front side of the second semiconductor substrates 210 and 260 may be opposite to the front side of the first semiconductor substrate 110. That is, the second semiconductor chip 200 and the third semiconductor chip 250 may be stacked on the first semiconductor chip 100 face to face, respectively.

The second semiconductor substrates 210 and 260 may be, for example, bulk silicon or SOI (silicon-on-insulator). The second semiconductor substrates 210 and 260 may be a silicon substrate or may include other substances, for example, silicon germanium, indium antimonide, lead tellurium compounds, indium arsenic, indium phosphide, gallium arsenide or gallium antimonide. Alternatively, the second semiconductor substrates 210 and 260 may have an epitaxial layer formed on the base substrate.

The second semiconductor element layers 220 and 270 may be placed on the front side (for example, lower sides the second semiconductor substrates 210 and 260) of the second semiconductor substrates 210 and 260. The second semiconductor element layers 220 and 270 may include various microelectronic elements, for example, MOSFET (metal-oxide-semiconductor field effect transistor) such as a CMOS transistor (complementary metal-insulator-semiconductor transistor), a system LSI (large scale integration), a flash memory, a DRAM, an SRAM, an EEPROM, a PRAM, an MRAM, a RERAM, or an image sensor such as CIS (CMOS imaging sensor), an MEMS (micro-electro-mechanical system), an active element, a passive element, and the like.

The second chip wiring layers 230 and 280 may cover the second semiconductor element layers 220 and 270. The second chip wiring layers 230 and 280 may be electrically connected to the second semiconductor element layers 220 and 270. For example, as shown in FIGS. 2A to 3, the second chip wiring layer 230 may include a second inter-chip wiring insulating film 235 that covers the second semiconductor element layers 220 and 270 and a second chip wiring structure 232 in the second inter-chip wiring insulating film 235; the second chip wiring layer 280 may include a second inter-chip wiring insulating film 285 that covers the second semiconductor element layers 220 and 270 and a second chip wiring structure 282 in the second inter-chip wiring insulating film 285. The second chip wiring structure 232 includes second chip wiring patterns 232a of a multi-layer structure and second chip via plugs 232b that interconnect the second chip wiring patterns 232a. The second semiconductor element layers 220 and 270 may be electrically connected to such a second chip wiring structure 232. In FIGS. 2A to 3, the arrangement, the number of layers, and the number of the first chip wiring structures 132 are only exemplary and are not limited thereto.

The second chip wiring structure 232 may include, for example, a conductive film and a barrier film interposed between the conductive film and the second inter-chip wiring insulating film 235. The conductive film of the second chip wiring structure 232 may include, but is not limited to, for example, at least one of tungsten (W), aluminum (Al), and copper (Cu). The barrier film of the second chip wiring structure 232 may include, but is not limited to, for example, at least one of titanium (Ti), titanium nitride (TiN), tantalum (Ta), and tantalum nitride (TaN).

The second bonding layers 240 and 290 may be placed on the second chip wiring layers 230 and 280. The second bonding layers 240 and 290 may cover at least a part of the lower sides of the second chip wiring layers 230 and 280. The second bonding layers 240 and 290 may be electrically connected to the second chip wiring layers 230 and 280. For example, the second bonding layers 240/290 may include a second bonding insulating film 244/294 that covers the second inter-chip wiring insulating film 235 and a second bonding metal pattern 242/292 in the second bonding insulating film 244/294. The second bonding metal pattern 242 may be connected to, for example, the second chip wiring pattern 232a at the bottom of the second chip wiring structure 232. Accordingly, the second bonding layers 240 and 290 may be electrically connected to the second semiconductor element layers 220 and 270.

In some embodiments, the second bonding metal pattern 242 may include a second bonding pad 242a and a second bonding via plug 242b. The second bonding pad 242a may be exposed from the second bonding insulating film 244. The second bonding via plug 242b may electrically connect the second bonding pad 242a and the second chip wiring structure 232.

The second bonding metal pattern 242 may include metals, but is not limited to, for example, copper (Cu), aluminum (Al) or tungsten (W). The second bonding insulating film 244 may include, but is not limited to, for example, oxide (silicon oxide) or polymer.

The second bonding layers 240 and 290 may be bonded to the first bonding layer 140. Therefore, the second semiconductor chip 200 and the third semiconductor chip 250 may be electrically connected to the first semiconductor chip 100, respectively.

In some embodiments, the first bonding layer 140 and the second bonding layers 240 and 290 may be bonded by a hybrid bonding method. The hybrid bonding method means a bonding method of bonding a metal and an oxide or a metal and a polymer at the same time. For example, as shown in FIG. 2A, the second bonding pad 242a may be attached to the first bonding pad 142a and the second bonding insulating film 244 may be attached to the first bonding insulating film 144. As an example, the first bonding layer 140 and the second bonding layers 240 and 290 may be bonded by a copper-oxide hybrid bonding method. That is, the first bonding pad 142a and the second bonding pad 242a may include copper (Cu), and the first bonding insulating film 144 and the second bonding insulating film 244 may include silicon oxide.

In some embodiments, the first bonding layer 140 and the second bonding layers 240 and 290 may be bonded by a metal bonding method. For example, as shown in FIG. 2B, the second bonding pad 242a may be attached to the first bonding pad 142a. As an example, the first bonding layer 140 and the second bonding layers 240 and 290 may be bonded by a Cu—Cu bonding method. That is, the first bonding pad 142a and the second bonding pad 242a may include copper (Cu). The first bonding insulating film 144 and the second bonding insulating film 244 may be omitted. In such a case, the first inter-chip wiring insulating film 135 and the second inter-chip wiring insulating film 235 may be spaced part from each other.

In some embodiments, the second semiconductor chip 200 and the third semiconductor chip 250 may further include first chip through vias 215 and 265, respectively. The first chip through vias 215 and 265 may penetrate the second semiconductor substrates 210 and 260 and the second semiconductor element layers 220 and 270 and be connected to the second bonding layers 240 and 290. For example, as shown in FIG. 2A, the first chip through vias 215 and 265 may be connected to the second chip wiring pattern 232a of the top of the second chip wiring structure 232. Therefore, the first chip through vias 215 and 265 may be electrically connected to the first semiconductor chip 100.

In some embodiments, the first chip through vias 215 and 265 may include a columnar conductive film penetrating the second semiconductor substrates 210 and 260 and a barrier film interposed between the conductive film and the second semiconductor substrates 210 and 260. The conductive film of the first chip through vias 215 and 265 may include, but is not limited to, for example, at least one of Cu alloys such as Cu, CuSn, CuMg, CuNi, CuZn, CuPd, CuAu, CuRe and CuW, W, W alloys, Ni, Ru and Co. The barrier film of the first chip through vias 215 and 265 may include, but is not limited to, for example, at least one of titanium (Ti), titanium nitride (TiN), tantalum (Ta), or tantalum nitride (TaN), rubidium (Ru), cobalt (Co), manganese (Mn), tungsten nitride (WN), nickel (Ni), and nickel boride (NiB).

The first chip through vias 215 and 265 may further include an insulating film interposed between the barrier film and the first semiconductor substrate 210. The insulating film of the first chip through vias 215 and 265 may include, but is not limited to, for example, at least one of an oxide film, a nitride film, a carbide film, a polymer or a combination thereof.

In some embodiments, the first bonding layer 140 and the second bonding layers 240 and 290 may be bonded by an oxide bonding method. For example, as shown in FIG. 2C, the second bonding insulating film 244 may be attached to the first bonding insulating film 144. As an example, the first bonding layer 140 and the second bonding layers 240 and 290 may be bonded by an $SiO_2$—$SiO_2$ bonding method. That is, the first bonding insulating film 144 and the second bonding insulating film 244 may include silicon oxide. The first bonding pad 142a and the second bonding pad 242a may be omitted. In such a case, the first chip wiring structure 132 and the second chip wiring structure 232 may be electrically connected by the first chip through vias 215 and 265. For example, first chip through vias 215 and 265 connected to each of the first chip wiring structure 132 and the second chip wiring structure 232 may be formed and may be electrically connected.

The second semiconductor chip 200 and the third semiconductor chip 250 may be different types of semiconductor chips from the first semiconductor chip 100, respectively. As an example, the first semiconductor chip 100 may be a logic semiconductor chip and the second semiconductor chip 200 and the third semiconductor chip 250 may be memory semiconductor chips, respectively. The logic semiconductor chip may include, but is not limited to, for example, an application processor (AP) such as a CPU (Central Processing Unit), a GPU (Graphic Processing Unit), an FPGA (Field-Programmable Gate Array), a digital signal processor, an encryption processor, a micro processor, a micro controller, and an ASIC (Application-specific IC). The memory semiconductor chip may be, for example, a volatile memory such as a DRAM (dynamic random access memory) or an SRAM (static random access memory), or a non-volatile memory such as a flash memory, a PRAM (Phase-change Random Access Memory), an MRAM (Magnetoresistive Random Access Memory), an FeRAM (Ferroelectric Random Access Memory) or an RRAM (Resistive Random Access Memory).

In some embodiments, the second semiconductor chip 200 and the third semiconductor chip 250 may be different types of semiconductor chips from each other. As an example, the second semiconductor chip 200 may be a logic semiconductor chip and the third semiconductor chip 250 may be a memory semiconductor chip.

The passivation film 340 may extend along the upper side of the second semiconductor chip 200 and the upper side of the third semiconductor chip 250. For example, the passivation film 340 may extend along the back sides of the second semiconductor substrates 210 and 260 (e.g., the upper sides of the second semiconductor substrates 210 and 260). The passivation film 340 may not extend along the side faces of the second semiconductor chip 200 and the side faces of the third semiconductor chip 250. A thickness T1 of the passivation film 340 may be about 1 μm to about 20 μm. Preferably, the thickness T1 of the passivation film 340 may be about 5 μm to about 10 μm.

The passivation film 340 may protect the second semiconductor chip 200 and the third semiconductor chip 250 from an external impact and moisture. The passivation film 340 may include, but is not limited to, for example, at least one of silicon oxide, silicon nitride, and silicon oxynitride.

In some embodiments, the passivation film 340 may be formed of multiple films. For example, as shown in FIG. 3, the passivation film 340 may include a first sub-passivation film 342 and a second sub-passivation film 344 that are sequentially stacked on the upper side of the second semiconductor chip 200 and the upper side of the third semiconductor chip 250. The first sub-passivation film 342 and the second sub-passivation film 344 may include different substances from each other. As an example, the first sub-passivation film 342 may be an oxide film (e.g., a silicon oxide film), and the second sub-passivation film 344 may be a nitride film (e.g., a silicon nitride film).

In some embodiments, the first chip through vias 215 and 265 may penetrate the passivation film 340 and be exposed from the upper side of the passivation film 340. Accordingly, the first chip through vias 215 and 265 may be electrically connected to a redistribution stack 400 to be described below. In some embodiments, the upper sides of the first chip through vias 215 and 265 may be placed on the same plane as the upper side of the passivation film 340. As used herein, the term "same" means not only the exactly same thing, but also minute differences that may occur due to process margins and the like.

The liner film 310 may extend along the profiles of the upper side of the first semiconductor chip 100, the side faces of the second semiconductor chip 200, the side faces of the third semiconductor chip 250 and the side faces of the passivation film 340. The liner film 310 may extend substantially conformally. A thickness T2 of the liner film 310 may be about 1 μm or less. For example, the thickness T2 of the liner film 310 may be about 0.01 μm to about 0.1 μm.

The upper side of the second semiconductor chip 200 and the upper side of the third semiconductor chip 250 may be located to be lower than the upper side of the liner film 310, respectively. For example, the height H1 of the upper side of the second semiconductor chip 200 and the upper side of the third semiconductor chip 250 may each be lower than the height H2 of the upper side of the liner film 310 from the upper side of the first semiconductor chip 100. In some embodiments, the upper side of the liner film 310 may be placed on the same plane as the upper side of the passivation film 340.

The height H1 of the upper side of the second semiconductor chip 200 and the upper side of the third semiconductor chip 250 may be about 1 μm to about 100 μm from the upper side of the first semiconductor chip 100. Preferably, the height H1 of the upper side of the second semiconductor chip 200 and the upper side of the third semiconductor chip 250 may be about 5 μm to about 40 μ, respectively. More preferably, the height H1 of the upper side of the second semiconductor chip 200 and the upper side of the third semiconductor chip 250 may be about 20 μm to about 40 μm, respectively.

The liner film 310 may function as an etch stop layer. The liner film 310 may include, but is not limited to, for example, at least one of silicon nitride and silicon oxynitride. In some other embodiments, the liner film 310 may be omitted.

Multiple gap fill films 320 and 330 may be formed on the liner film 310. The multiple gap fill films 320 and 330 may fill a region between the second semiconductor chip 200 and the third semiconductor chip 250. The multiple gap fill films 320 and 330 may include an inorganic filling film 320 and an organic filling film 330 which are sequentially stacked on the liner film 310.

The inorganic filling film 320 may extend along the profiles of the upper side of the first semiconductor chip 100, the side faces of the second semiconductor chip 200, the side faces of the third semiconductor chip 250, and the side faces of the passivation film 340. Therefore, the inorganic filling film 320 may fill a part of the region between the second semiconductor chip 200 and the third semiconductor chip 250. The inorganic filling film 320 may extend substantially conformally. A thickness T3 of the inorganic filling film 320 may be greater than the thickness T2 of the liner film 310. The thickness T3 of the inorganic filling film 320 may be, for example, about 1 μm to about 50 μm. Preferably, the thickness T3 of the inorganic filling film 320 may be about 1 μm to about 20 μm.

The inorganic filling film 320 may include inorganic matters having gap filling properties. For example, the inorganic filling film 320 may include a silicon oxide or silicon nitride-based membrane. Preferably, the inorganic filling film 320 may include at least one of silicon nitride (SiN), silicon oxycarbide (SiCO), and silicon carbonitride (SiCN). The inorganic filling film 320 may be formed, but is not limited to, for example, by a plasma enhanced chemical vapor deposition (PECVD), a low temperature chemical vapor deposition (LT CVD) or an atomic layer deposition (ALD).

The organic filling film 330 may be formed on the inorganic filling film 320. The organic filling film 330 may fill the remaining region between the second semiconductor chip 200 and the third semiconductor chip 250 that remains after being filled by the inorganic filling film 320. A thickness T4 of the organic filling film 330 may be, for example, about 1 μm to about 70 μm. Preferably, the thickness T4 of the organic filling film 330 may be about 1 μm to about 30 μm. Although the thickness T4 of the organic filling film 330 is only shown as being smaller than the thickness T3 of the inorganic filling film 320, this is only an example, and the thickness T4 of the organic filling film 330 may, of course, be equal to or greater than the thickness T3 of the inorganic filling film 320.

The organic filling film 330 may include an organic matter having the gap filling property. For example, the organic filling film 330 may include at least one of PBO (polybenzoxazole), BCB (benzocyclobutene), PI (polyimide) and SOD (spin-on dielectric). The organic filling film 330 may be formed, but is not limited to, for example, by spin coating or slit coating.

The upper side of the second semiconductor chip 200 and the upper side of the third semiconductor chip 250 may be located to be lower than the upper sides of the multiple gap fill films 320 and 330, respectively. For example, from the upper side of the first semiconductor chip 100, the height H1 of the upper side of the second semiconductor chip 200 and the upper side of the third semiconductor chip 250 may each be lower than the height H2 of the upper sides of the multiple of gap fill films 320 and 330. In some embodiments, the upper sides of the multiple gap fill films 320 and 330 may be placed on the same plane as the upper side of the passivation film 340. In some embodiments, the upper side of the organic filling film 330 may be placed on the same plane as the upper side of the inorganic filling film 320.

The redistribution stack 400 may be formed on the passivation film 340 and the multiple gap fill films 320 and 330. For example, the redistribution stack 400 may extend along the upper side of the passivation film 340, the upper side of the liner film 310 and the upper sides of the multiple gap fill films 320 and 330. Accordingly, a fan-out type semiconductor package in which input/output terminals are also placed outside the semiconductor chip (for example, the second semiconductor chip 200 and the third semiconductor chip 250) may be implemented.

The redistribution stack 400 may be electrically connected to the first chip through vias 215 and 265. Accordingly, the first semiconductor chip 100, the second semiconductor chip 200 and/or the third semiconductor chip 250 may be electrically connected to the redistribution stack 400. For example, the redistribution stack 400 may include redistribution insulating films (e.g., first to fourth redistribution insulating films) 410, 420, 430 and 440 that are sequentially stacked on the passivation film 340 and the multiple gap fill films 320 and 330 and redistribution structures 412, 422, 424, 432, and 434 inside the redistribution insulating films 410, 420, 430 and 440. The redistribution structures 412, 422, 424, 432, and 434 may include redistribution via plugs (e.g., first and second redistribution via plugs) 424 and 434 that interconnect redistribution patterns of a multi-layer structure (e.g., first to third redistribution patterns) 412, 422 and 432. The first chip through vias 215 and 265 may penetrate the passivation film 340 and be electrically connected to the redistribution structures 412, 422, 424, 432, and 434. In FIG. 1, the arrangement, the number of layers, the number or the like of the redistribution structures 412, 422, 424, 432, and 434 are only exemplary, and are not limited thereto.

The redistribution stack 400 may be a redistribution stack of a wafer level package (WLP) fabricated at a wafer level and may be a redistribution stack of a package level package (PLP) fabricated at a package level.

In some embodiments, the first chip through vias 215 and 265 may be connected to the first redistribution pattern 412 located at the bottom of the redistribution patterns 412, 422 and 432. Accordingly, the first semiconductor chip 100, the second semiconductor chip 200 and/or the third semiconductor chip 250 may be electrically connected to the redistribution stack 400.

A plurality of first connection bumps 450 may be formed on the redistribution stack 400. The first connection bumps 450 may each be electrically connected to redistribution stack 400. For example, the redistribution stack 400 may include a redistribution pad 445 in the fourth redistribution insulating film 440 placed at the top of the redistribution insulating films 410, 420, 430 and 440. The first connection bumps 450 may each be connected to the redistribution pad 445. Therefore, the first semiconductor chip 100, the second semiconductor chip 200 and/or the third semiconductor chip 250 may be electrically connected to the first connection bumps 450. The first semiconductor chip 100, the second semiconductor chip 200 and/or the third semiconductor chip 250 may be electrically connected to an external device (for example, a panel of an electronic device etc.) through the first connection bumps 450.

The first connection bumps 450 may include, for example, a solder ball, a bump, a UBM (under bump metallurgy), and the like. The first connection bumps 450 may include, but are not limited to, metals such as tin (Sn).

Figure 4:
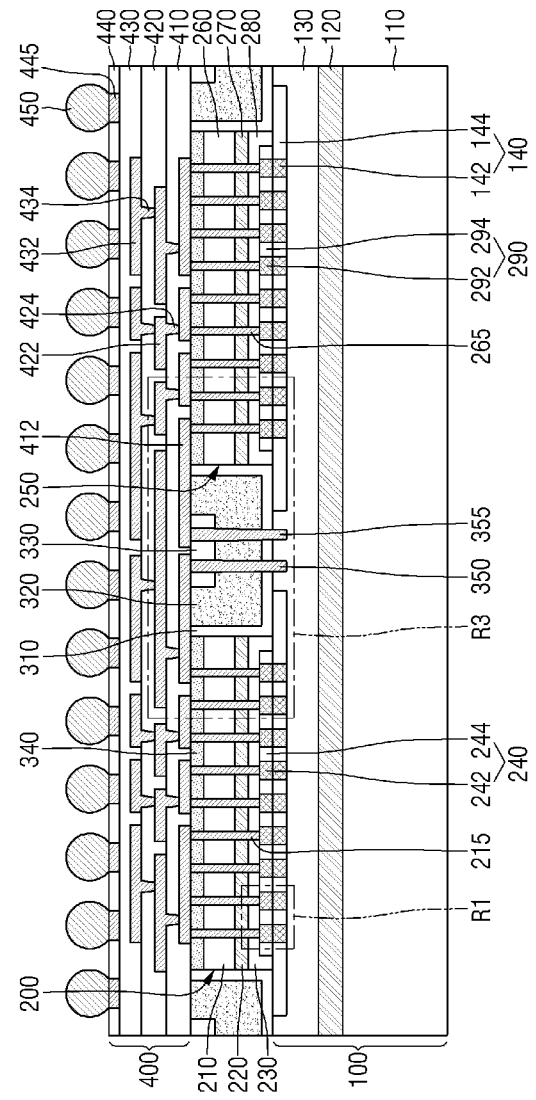
FIG. 4 is a schematic cross-sectional view for explaining a semiconductor package according to some embodiments.
Figure 5:
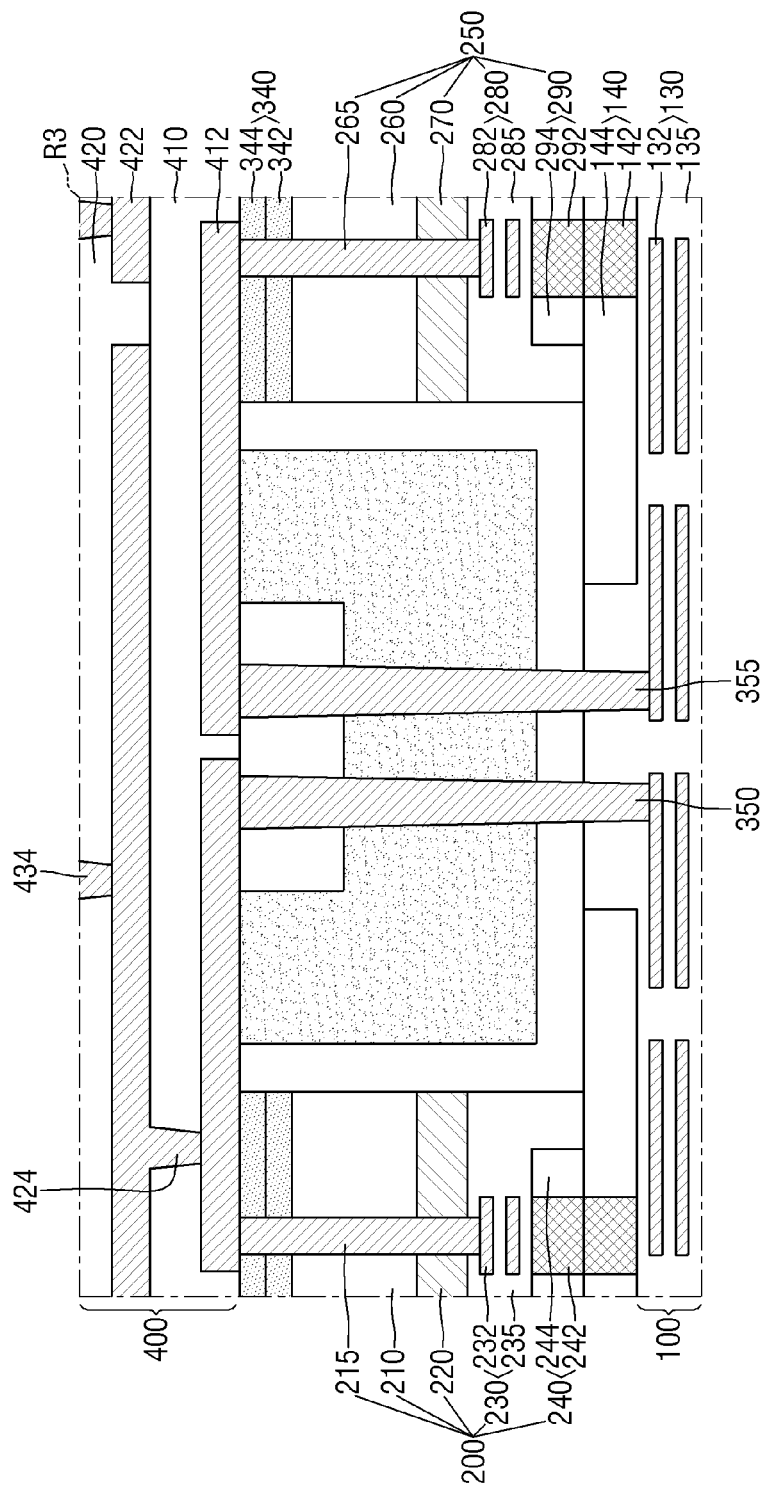
FIG. 5 is an enlarged view for explaining a region R3 of FIG. 4.

FIG. 4 is a schematic cross-sectional view for explaining a semiconductor package according to some embodiments. FIG. 5 is an enlarged view for explaining a region R3 of FIG. 4. For convenience of explanation, repeated parts of contents explained above using FIGS. 1 to 3 will be briefly explained or omitted.

Referring to FIGS. 4 and 5, the semiconductor packages according to some embodiments further include gap fill film through vias 350 and 355.

The gap fill film through vias 350 and 355 may be interposed between the second semiconductor chip 200 and the third semiconductor chip 250. The gap fill film through vias 350 and 355 may penetrate multiple gap fill films 320 and 330 and be connected to the first semiconductor chip 100. For example, as shown in FIG. 5, the gap fill film through vias 350 and 355 sequentially penetrate the organic filling film 330, the inorganic filling film 320, and the liner film 310 and are connected to the first chip wiring pattern 132a at the top of the first chip wiring structure 132.

Further, the gap fill film through vias 350 and 355 may be connected to the redistribution stack 400. For example, the upper side of the gap fill film through vias 350 and 355 may be connected to at least some of the redistribution patterns 412, 422 and 432. Accordingly, the gap fill film through vias 350 and 355 may electrically connect the first semiconductor chip 100 to the redistribution stack 400.

In some embodiments, the gap fill film through vias 350 and 355 may be connected to the first chip through vias 215 and 265. For example, the redistribution patterns 412, 422 and 432 may electrically connect the first chip through vias 215 and 265 and the gap fill film through vias 350 and 355.

In some embodiments, the gap fill film through vias 350 and 355 may be connected to the first redistribution pattern 412 placed at the bottom of the redistribution patterns 412, 422 and 432. For example, the upper sides of the gap fill film through vias 350 and 355 may be placed on the same plane as the upper sides of the multiple gap fill films 320 and 330.

In some embodiments, the widths of the gap fill film through vias 350 and 355 may decrease as they go away from the first redistribution pattern 412. This may be due to the characteristics of the etching process for forming the gap fill film through vias 350 and 355.

Figure 6:
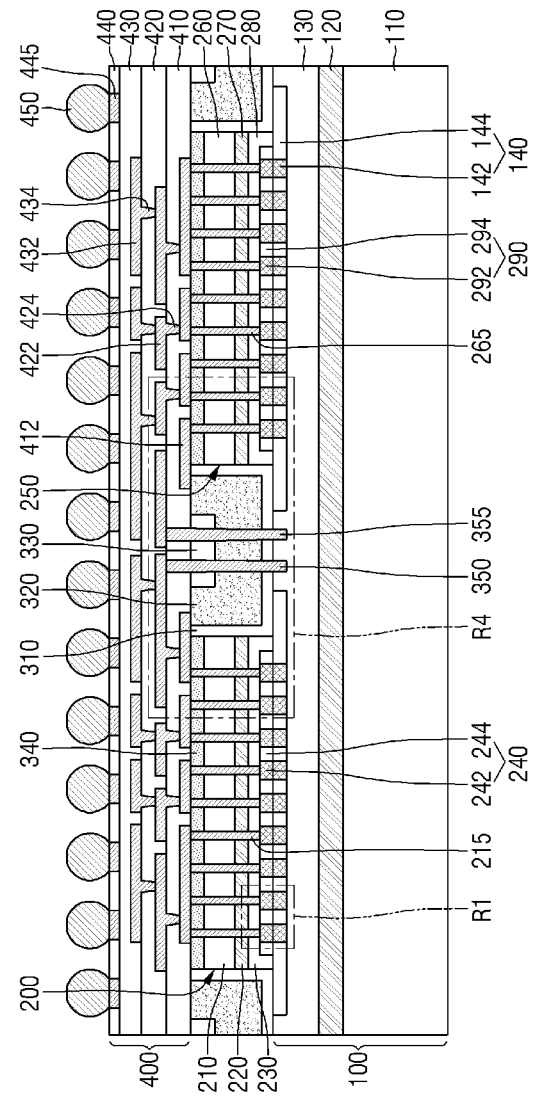
FIG. 6 is a schematic cross-sectional view for explaining the semiconductor package according to some embodiments.
Figure 7:
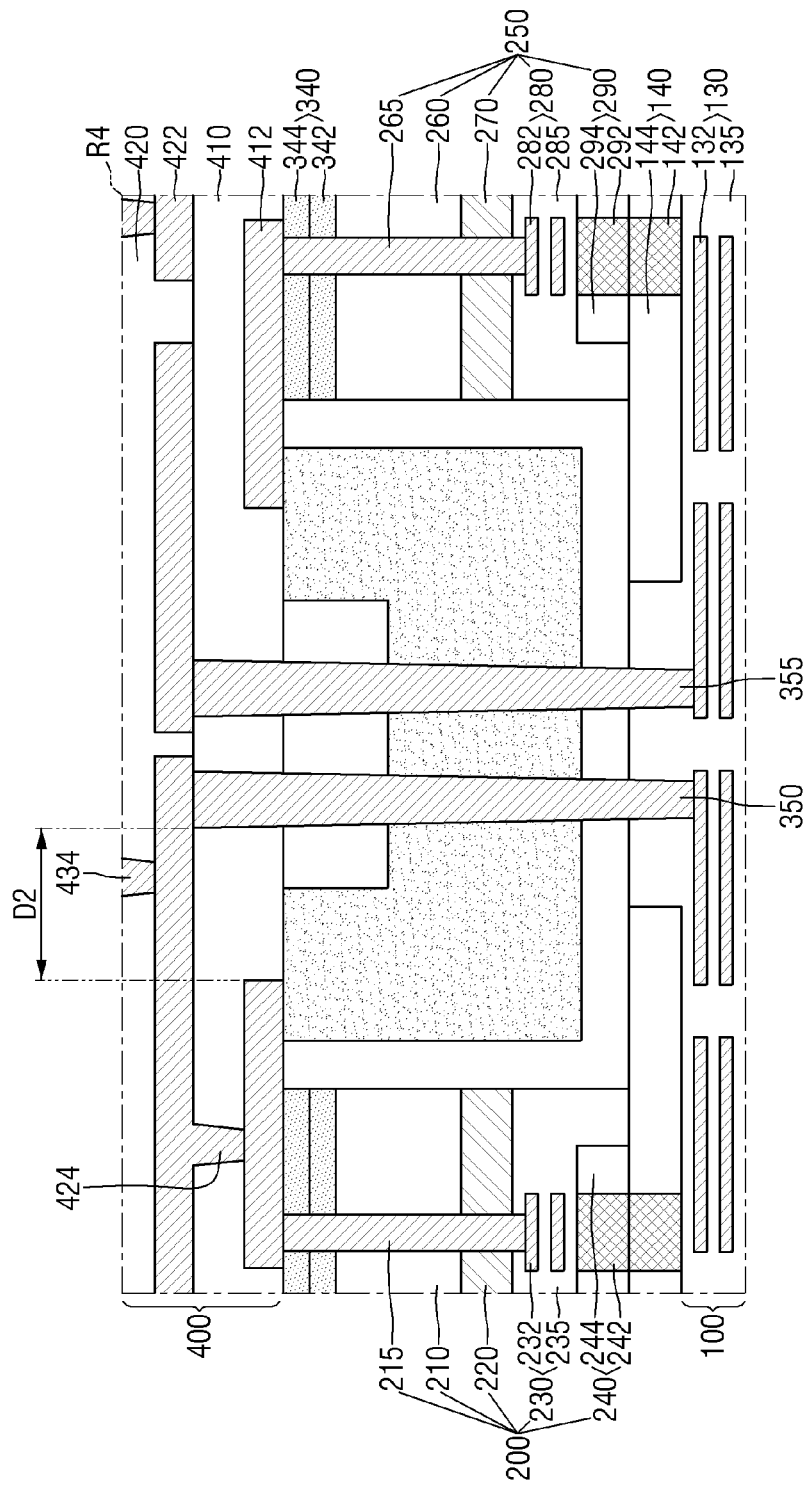
FIG. 7 is an enlarged view for explaining a region R4 of FIG. 6.

FIG. 6 is a schematic cross-sectional view for explaining the semiconductor package according to some embodiments. FIG. 7 is an enlarged view for explaining a region R4 of FIG. 6. For convenience of explanation, repeated parts of contents explained above using FIGS. 1 to 5 will be briefly explained or omitted.

Referring to FIGS. 6 and 7, in the semiconductor package according to some embodiments, the upper side of the gap fill film through vias 350 and 355 are located to be higher than the upper sides of the multiple gap fill films 320 and 330.

For example, the gap fill film through vias 350 and 355 may be connected to a second redistribution pattern 422 placed on the first redistribution pattern 412. In some embodiments, the upper sides of the gap fill film through vias 350 and 355 may be placed on the same plane as the upper side of the first redistribution insulating film 410 that covers the first redistribution pattern 412.

Among the redistribution patterns 412, 422 and 432, the redistribution pattern (e.g., the first redistribution pattern 412) placed under the redistribution pattern (e.g., the second redistribution pattern 422) connected to the gap fill film through vias 350 and 355 may be spaced apart from the gap fill film through vias 350 and 355 by a predetermined distance. A distance D2 by which the first redistribution pattern 412 is spaced apart from the gap fill film through vias 350 and 355 may be, for example, about 1 µm to about 10 µm. Preferably, the distance D2 by which the first redistribution pattern 412 is spaced apart from the gap fill film through vias 350 and 355 may be, for example, about 1 µm to about 6 µm.

In some embodiments, the width of the gap fill film through vias 350 and 355 may decrease as they go away from the second redistribution pattern 422. This may be due to the characteristics of the etching process for forming the gap fill film through vias 350 and 355.

Figure 8:
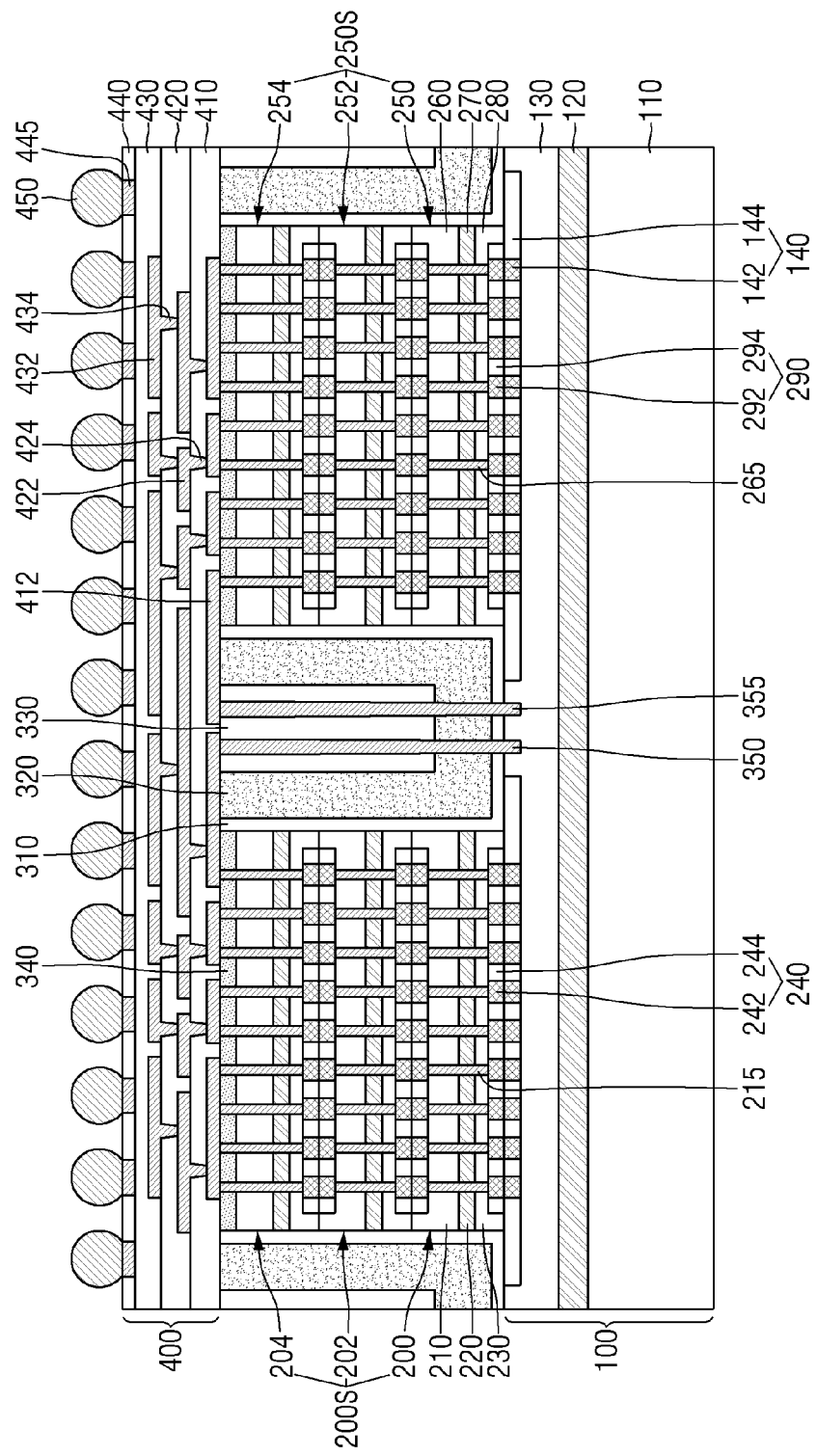
FIG. 8 is a schematic cross-sectional view for explaining the semiconductor package according to some embodiments.

FIG. 8 is a schematic cross-sectional view for explaining the semiconductor package according to some embodiments. For convenience of explanation, repeated parts of contents explained above using FIGS. 1 to 7 will be briefly described or omitted.

Referring to FIG. 8, the semiconductor package according to some embodiments includes a first chip stack 200S and a second chip stack 250S.

The first chip stack 200S may include a plurality of semiconductor chips including a second semiconductor chip 200, and the second chip stack 250S may include a plurality of semiconductor chips including a third semiconductor chip 250. For example, the first chip stack 200S may include a second semiconductor chip 200 and fourth and fifth semiconductor chips 202 and 204 that are sequentially stacked on the second semiconductor chip 200. Further, for example, the second chip stack 250S may include a third semiconductor chip 250 and sixth and seventh semiconductor chip 252 and 254 that are sequentially stacked on the third semiconductor chip 250.

In some embodiments, the semiconductor chips 200, 202, 204, 250, 252 and 254 of the first chip stack 200S and the second chip stack 250S may include second semiconductor substrates 210 and 260, second semiconductor element layers 220 and 270, second chip wiring layers 230 and 280, second bonding layers 240 and 290, and first chip through vias 215 and 265. The semiconductor chips 200, 202 and 204 of the first chip stack 200S may be connected to each other through the second bonding layer 240 of the first chip stack 200S and the first chip through via 215. The semiconductor chips 250, 252 and 254 of the second chip stack 250S may be connected to each other through the second bonding layer 290 of the second chip stack 250S and the first chip through via 265.

In some embodiments, the passivation film 340 may extend along the upper side of the first chip stack 200S and the upper side of the second chip stack 250S. For example, the passivation film 340 may extend along an upper side of a fifth semiconductor chip 204 placed at the top of the semiconductor chips 200, 202 and 204 of the first chip stack 200S, and an upper side of a seventh semiconductor chip 254 placed at the top of the semiconductor chips 250, 252 and 254 of the second chip stack 250S. The passivation film 340 may not extend along the side faces of the first chip stack 200S and the side faces of the second chip stack 250S.

In some embodiments, the upper side of the liner film 310 and the upper sides of the multiple gap fill films 320 and 330 may be placed on the same plane as the upper side of the passivation film 340.

Figure 9:
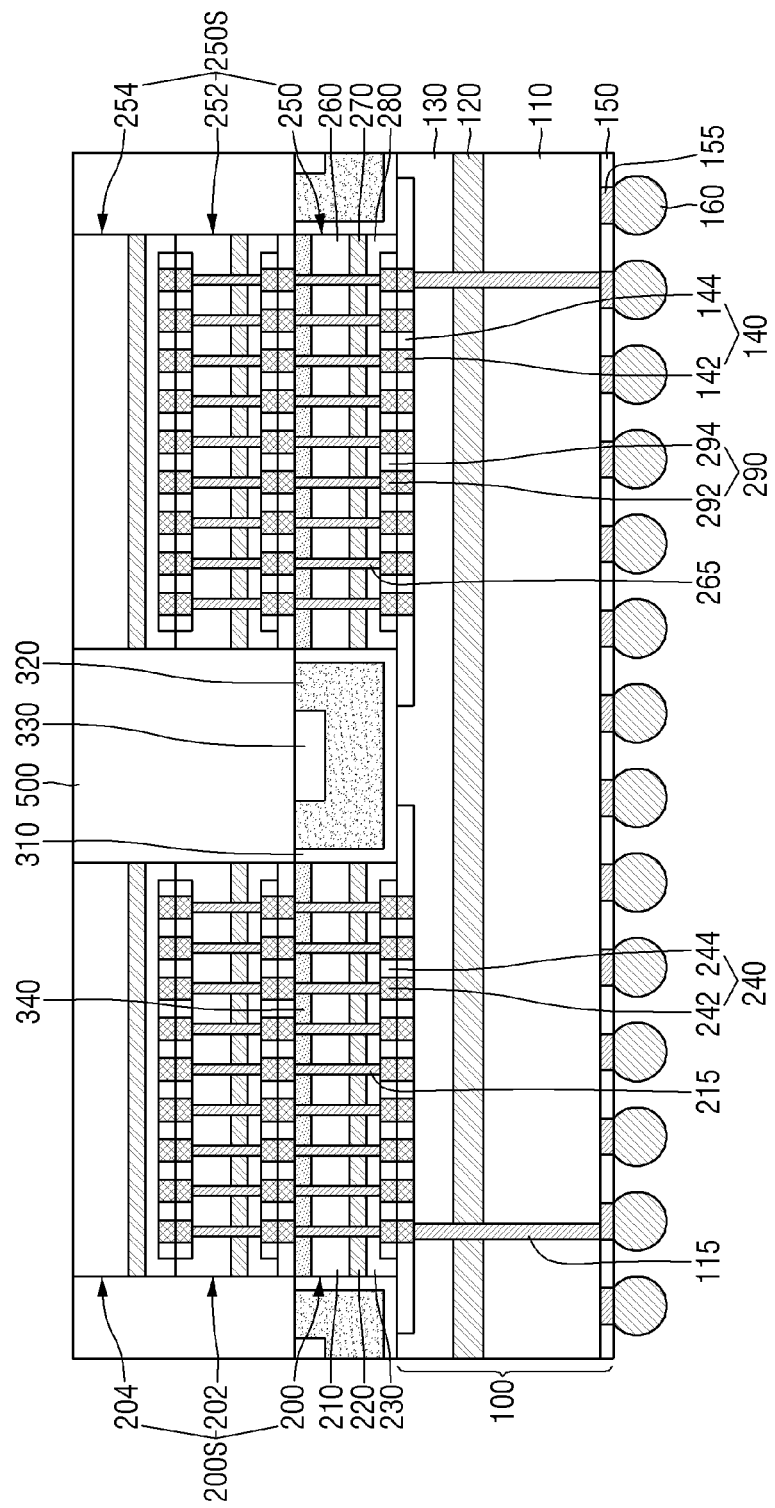
FIG. 9 is a schematic cross-sectional view for explaining a semiconductor package according to some embodiments.

FIG. 9 is a schematic cross-sectional view for explaining a semiconductor package according to some embodiments. For convenience of explanation, repeated parts of contents explained above using FIGS. 1 to 8 will be briefly explained or omitted.

Referring to FIG. 9, in the semiconductor package according to some embodiments, the fourth to seventh semiconductor chips 202, 204, 252 and 254 may be stacked on the passivation film 340.

For example, the fourth and fifth semiconductor chips 202 and 204 may be stacked on the passivation film 340 extending along the upper side of the second semiconductor chip 200 and the sixth and seventh semiconductor chip 252 and 254 may be stacked on the passivation film 340 extending along the upper side of the third semiconductor chip 250.

In some embodiments, the first chip through via 215 of the second semiconductor chip 200 may penetrate the passivation film 340 and be connected to the second bonding layer 240 of the fourth semiconductor chip 202. The first chip through via 265 of the third semiconductor chip 250 may penetrate the passivation film 340 and be connected to the second bonding layer 290 of the sixth semiconductor chip 252.

In some embodiments, the upper side of the liner film 310 and the upper sides of the multiple gap fill films 320 and 330 may be placed on the same plane as the upper side of the passivation film 340.

In some embodiments, a molding member 500 may be formed on the multiple gap fill films 320 and 330, the first chip stack 200S and the second chip stack 250S. The molding member 500 may fill the region between the first chip stack 200S and the second chip stack 250S on the multiple gap fill films 320 and 330. Although the molding member 500 is only shown to expose the upper side of the first chip stack 200S and the upper side of the second chip stack 250S, this is only exemplary. The molding member 500 may include, but is not limited to, for example, an insulating polymer material such as an EMC (epoxy molding compound).

In some embodiments, a plurality of second connection bumps 160 may be formed on the back side of the first semiconductor substrate 110. The second connection bumps 160 may be electrically connected to the first semiconductor chip 100, the second semiconductor chip 200 and/or the third semiconductor chip 250. For example, a back side insulating film 150 which covers the back side of the first semiconductor substrate 110 (e.g., a lower side of the first semiconductor substrate 110) and a back side pad 155 in the back side insulating film 150 may be formed. Each of the second connection bumps 160 may be connected to the back side pad 155.

In some embodiments, the second connection bumps 160 may each be electrically connected to the first bonding layer 140. For example, a second chip through via 115, which penetrates the first semiconductor substrate 110, the first semiconductor element layer 120, and the first chip wiring layer 130 and connects the first bonding layer 140 and the back side pad 155, may be formed. Therefore, the first semiconductor chip 100, the second semiconductor chip 200 and/or the third semiconductor chip 250 may be electrically connected to the second connection bump 160. The first semiconductor chip 100, the second semiconductor chip 200 and/or the third semiconductor chip 250 may be electrically connected to an external device (for example, a panel of an electronic device) through the second connection bumps 160. In such a case, the redistribution stack 400 and the first connection bumps 450 connected to the first chip through vias 215 and 265 may be omitted.

In some embodiments, the second chip through via 115 may include a columnar conductive film which penetrates the first semiconductor substrate 110 and a barrier film which is interposed between the conductive film and the first semiconductor substrate 110. The conductive film of the second chip through via 115 may include, but is not limited to, for example, at least one of Cu alloys such as Cu, CuSn, CuMg, CuNi, CuZn, CuPd, CuAu, CuRe and CuW, W, W alloys, Ni, Ru and Co. The barrier film of the second chip through via 115 may include, but is not limited to, for example, at least one of titanium (Ti), titanium nitride (TiN), tantalum (Ta), or tantalum nitride (TaN), rubidium (Ru), cobalt (Co), manganese (Mn), tungsten nitride (WN), nickel (Ni), and nickel boride (NiB)

Hereinafter, a method for fabricating a semiconductor package according to exemplary embodiments will be described referring to FIGS. 1 to 7 and 10 to 21. For reference, FIGS. 11 to 21 are cross-sectional views taken along a line I-I of FIG. 10.

FIGS. 10 to 18 are intermediate stage diagrams for explaining a method for fabricating a semiconductor package according to some embodiments. For convenience of explanation, repeated parts of contents explained above using FIGS. 1 to 3 will be briefly explained or omitted.

Figure 10:
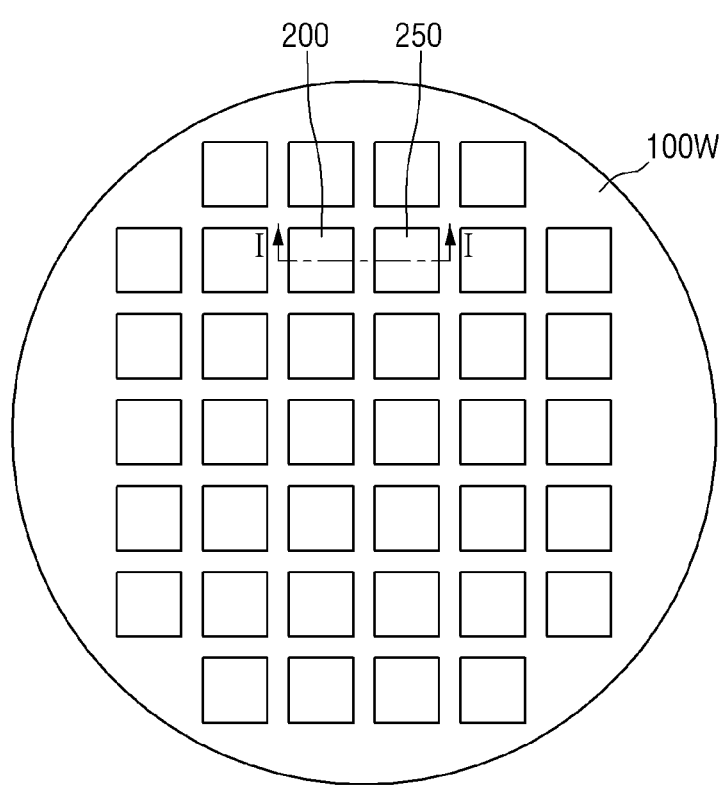
FIGS. 10 to 18 are intermediate stage diagrams for explaining a method for fabricating a semiconductor package according to some embodiments.
Figure 11:
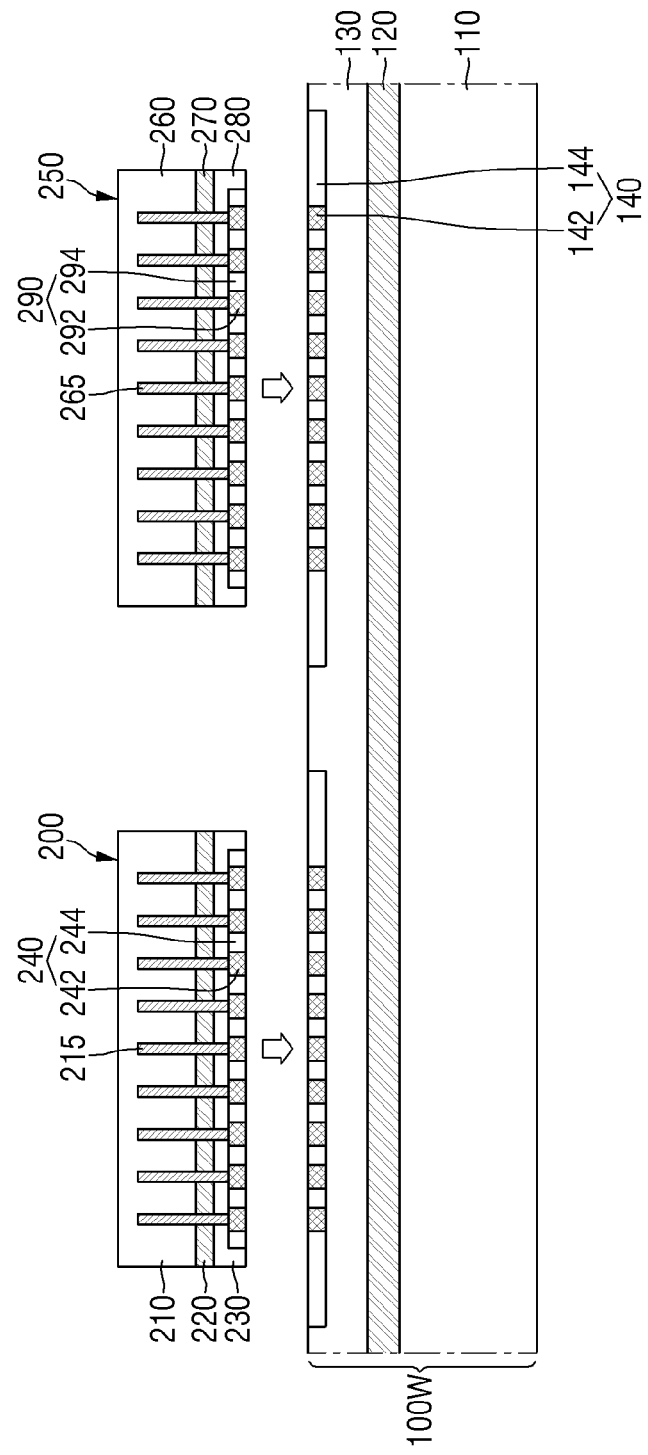

Referring to FIGS. 10 and 11, a second semiconductor chip 200 and a third semiconductor chip 250 are stacked on a wafer 100W, respectively.

The wafer 100W may include a first semiconductor substrate 110, a first semiconductor element layer 120, a first chip wiring layer 130, and a first bonding layer 140. In a dicing process to be described later, the wafer 100W may be divided into individual semiconductor chips to form the first semiconductor chip 100 explained above using FIGS. 1 to 3.

In some embodiments, the second semiconductor chip 200 and the third semiconductor chip 250 may be stacked on the wafer 100W by a C2W (or D2W) method, respectively. For example, the second bonding layers 240 and 290 of the second semiconductor chip 200 and the third semiconductor chip 250 may be bonded to the first bonding layer 140 of the wafer 100W.

In some embodiments, the first bonding layer 140 and the second bonding layers 240 and 290 may be bonded by a hybrid bonding method. As an example, the first bonding layer 140 and the second bonding layers 240 and 290 may be bonded by a copper-oxide hybrid bonding method.

In some embodiments, the first chip through vias 215 and 265 may not be exposed from the surface of the second semiconductor chip 200 and the surface of the third semiconductor chip 250. For example, the first chip through vias 215 and 265 may not be exposed from the back sides of the second semiconductor substrates 210 and 260. That is, the first chip through vias 215 and 265 may not completely penetrate the second semiconductor substrates 210 and 260.

Figure 12:
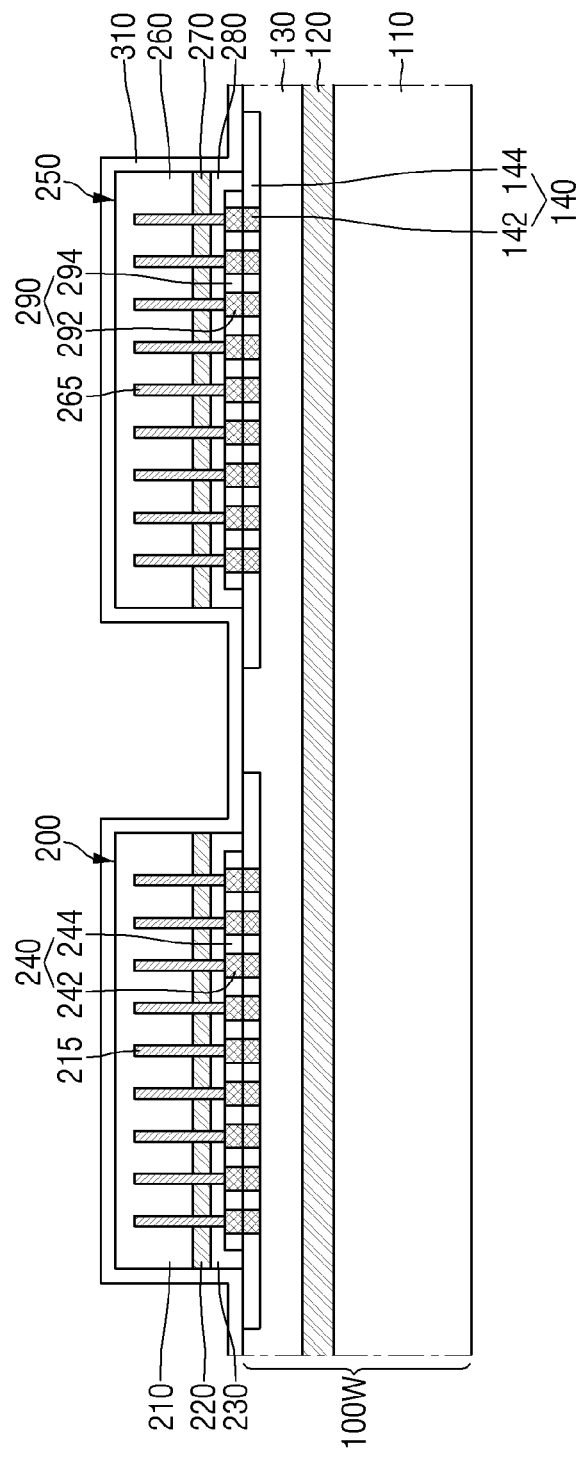

Referring to FIG. 12, the liner film 310 is formed on the wafer 100W, the second semiconductor chip 200 and the third semiconductor chip 250.

The liner film 310 may extend along the profiles of the upper side of the wafer 100W, the side faces and upper side of the second semiconductor chip 200, and the side faces and upper side of the third semiconductor chip 250. The liner film 310 may extend substantially conformally.

The liner film 310 may function as an etch stop layer in a subsequent process step. The liner film 310 may include, but is not limited to, for example, at least one of silicon nitride and silicon oxynitride. In some other embodiments, the liner film 310 may be omitted.

Figure 13:
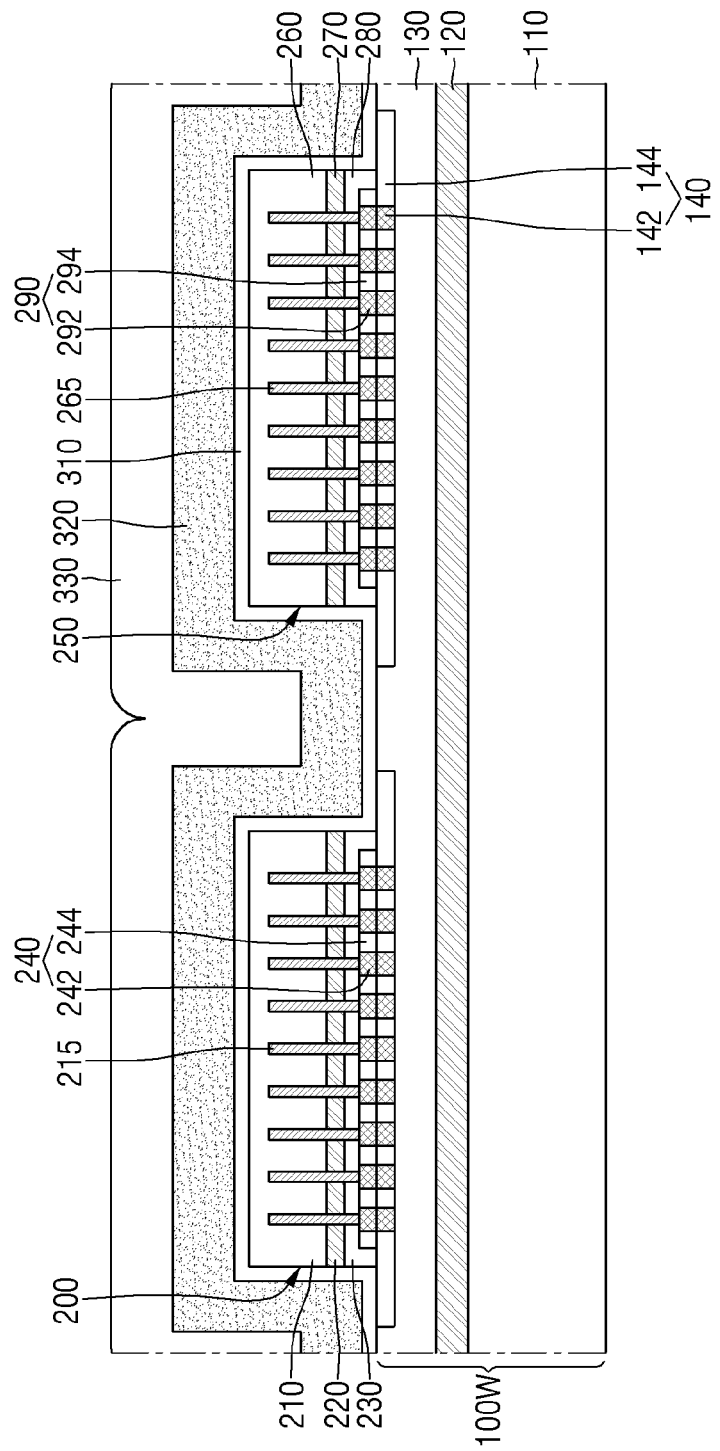

Referring to FIG. 13, multiple gap fill films 320 and 330 are formed on the liner film 310.

The multiple gap fill films 320 and 330 may fill the region between the second semiconductor chip 200 and the third semiconductor chip 250. The multiple gap fill films 320 and 330 may include an inorganic filling film 320 and an organic filling film 330 which are sequentially stacked on the liner film 310.

The inorganic filling film 320 may extend along the profile of the liner film 310, and the organic filling film 330 may extend along the profile of the inorganic filling film 320. The inorganic filling film 320 and the organic filling film 330 may each substantially conformally extend.

The inorganic filling film 320 may include inorganic matters having gap filling properties. For example, the inorganic filling film 320 may include a silicon oxide or silicon nitride-based membrane. Preferably, the inorganic filling film 320 may include at least one of silicon nitride (SiN), silicon oxycarbide (SiCO), and silicon carbonitride (SiCN). The inorganic filling film 320 may be formed, but is not limited to, for example, by a plasma enhanced chemical vapor deposition (PECVD), a furnace chemical vapor deposition (F-CVD), a low temperature chemical vapor deposition (LT CVD) or an atomic layer deposition (ALD).

The organic filling film 330 may include organic matters having gap filling properties. For example, the organic filling film 330 may include at least one of PBO (poly para-phenylene benzo-bisoxazole), BCB (Benzocyclobutene), PI (polyimide), and SOD (spin-on dielectric). The organic filling film 330 may be formed, but is not limited thereto, for example, by spin coating or slit coating.

Figure 14:
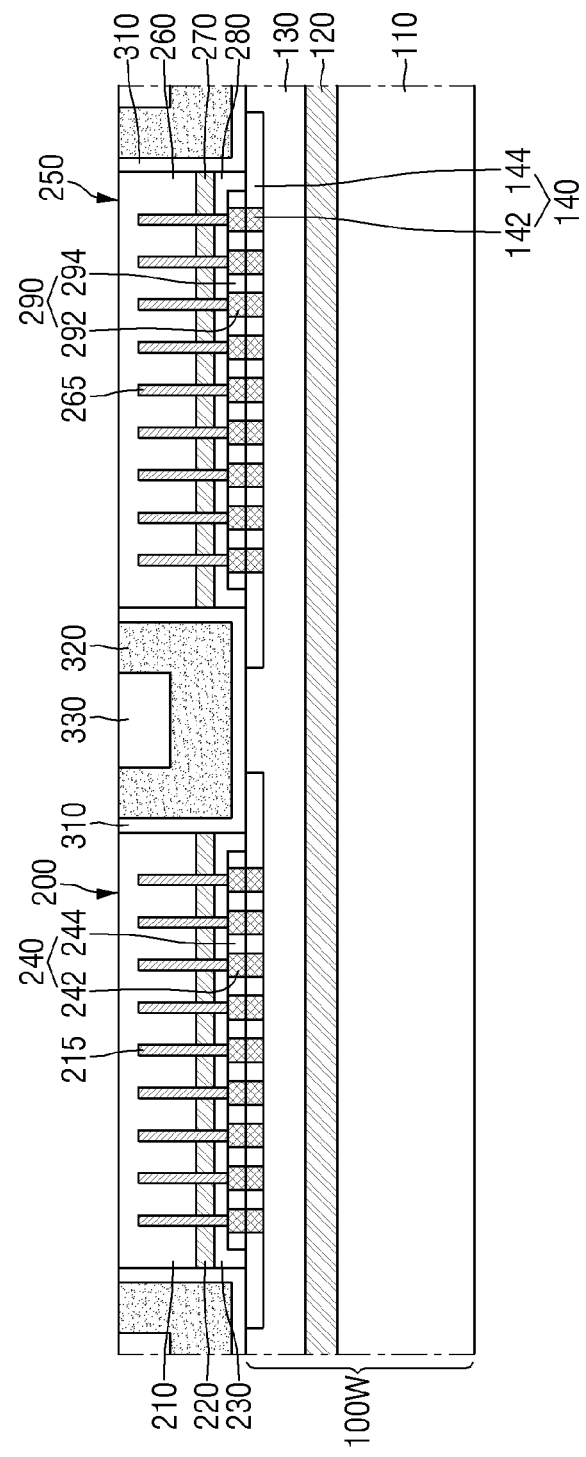

Referring to FIG. 14, the upper sides of the second semiconductor substrates 210 and 260 are exposed.

For example, a first flattening process of exposing the back sides of the second semiconductor substrates 210 and 260 (e.g., the upper sides of the second semiconductor substrates 210 and 260) may be performed. By the aforementioned first flattening process, the liner film 310 and the multiple gap fill films 320 and 330 formed to be higher than the back sides of the second semiconductor substrates 210 and 260 may be removed. The liner film 310 and the multiple gap fill films 320 and 330 formed in the region between the second semiconductor chip 200 and the third semiconductor chip 250 may remain without being removed, by the first flattening process. In some embodiments, the first flattening process may include a back grinding process.

Figure 15:
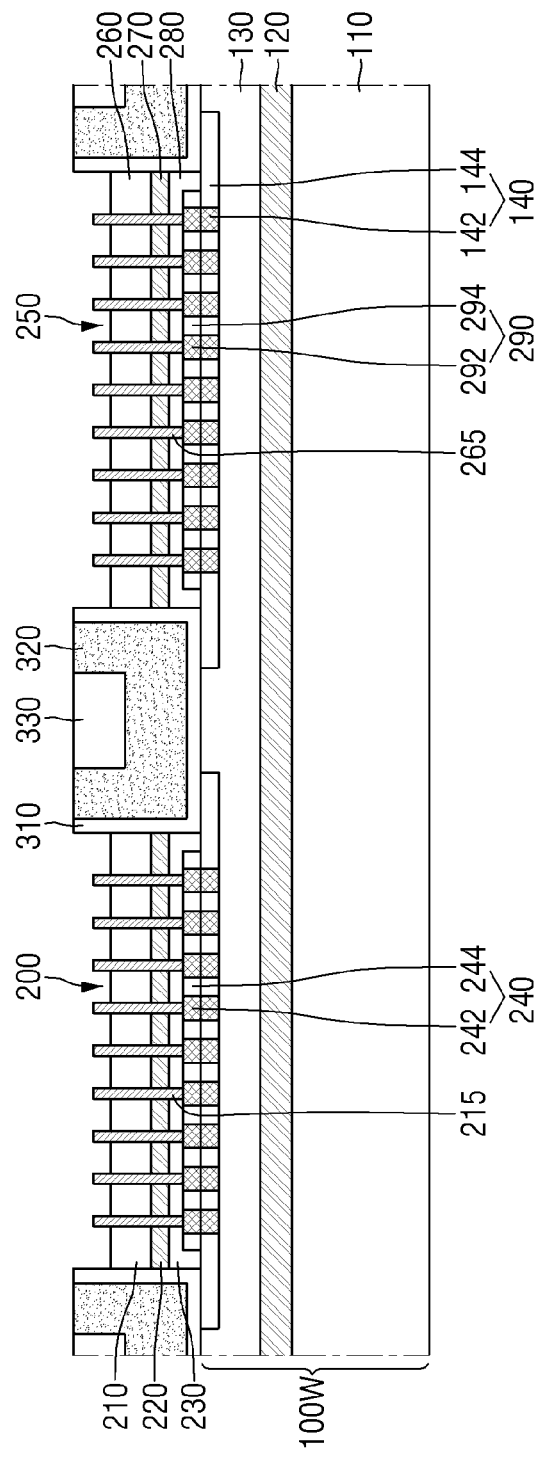

Referring to FIG. 15, the first chip through vias 215 and 265 are exposed.

For example, a recess process may be performed on the back sides of the second semiconductor substrates 210 and 260 (for example, the upper sides of the second semiconductor substrates 210 and 260). By the recess process, the first chip through vias 215 and 265 may be exposed from the back sides of the second semiconductor substrates 210 and 260. Further, the first chip through vias 215 and 265 may completely penetrate the second semiconductor substrates 210 and 260. In some embodiments, the recess process may be performed until the back sides of the second semiconductor substrates 210 and 260 become lower than the upper sides of the first chip through vias 215 and 265.

In some embodiments, the second semiconductor substrates 210 and 260 may have an etching selectivity compared to the liner film 310 and the multiple gap fill films 320 and 330. That is, in the recess process, the etch rate of the second semiconductor substrates 210 and 260 may be greater than that of the liner film 310 and the multiple gap fill films 320 and 330. As a result, after the recess process is performed, the upper sides of the second semiconductor chip 200 and the third semiconductor chip 250 may be located to be lower than the upper sides of the liner film 310 and the multiple gap fill films 320 and 330.

Figure 16:
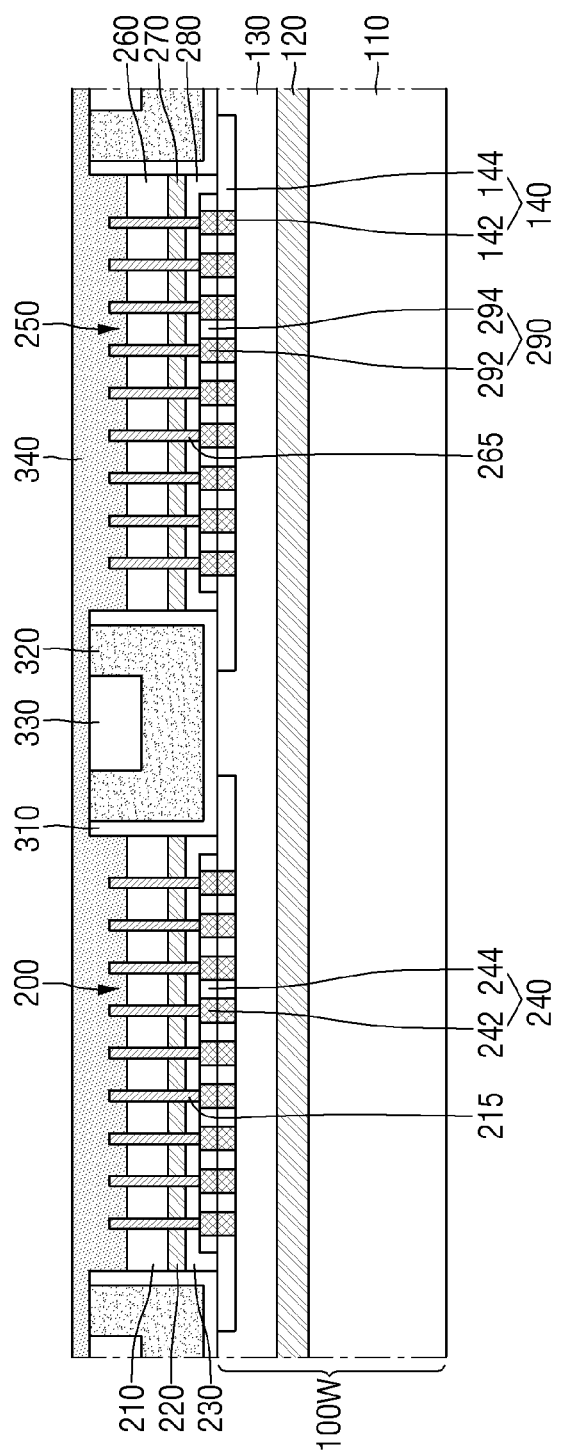

Referring to FIG. 16, a passivation film 340 is formed on the second semiconductor chip 200, the third semiconductor chip 250, and the multiple gap fill films 320 and 330.

The passivation film 340 may extend along the upper side of the second semiconductor chip 200, the upper side of the third semiconductor chip 250, and the upper sides of the multiple gap fill films 320 and 330. Further, the passivation film 340 may extend along the side faces and upper sides of the first chip through vias 215 and 265 exposed from the second semiconductor chip 200 and the third semiconductor chip 250 and the side faces and upper side of the liner film 310 exposed from the second semiconductor chip 200 and the third semiconductor chip 250.

The passivation film 340 may protect the second semiconductor chip 200 and the third semiconductor chip 250 from an external impact and moisture. The passivation film 340 may include, for example, but is not limited to, at least one of silicon oxide, silicon nitride and silicon oxynitride.

In some embodiments, the passivation film 340 may be formed of multiple films. As an example, the passivation film 340 may include a first silicon oxide film, a silicon nitride film and a second silicon oxide film that are sequentially stacked on the second semiconductor chip 200, the third semiconductor chip 250 and the multiple gap fill films 320 and 330.

Figure 17:
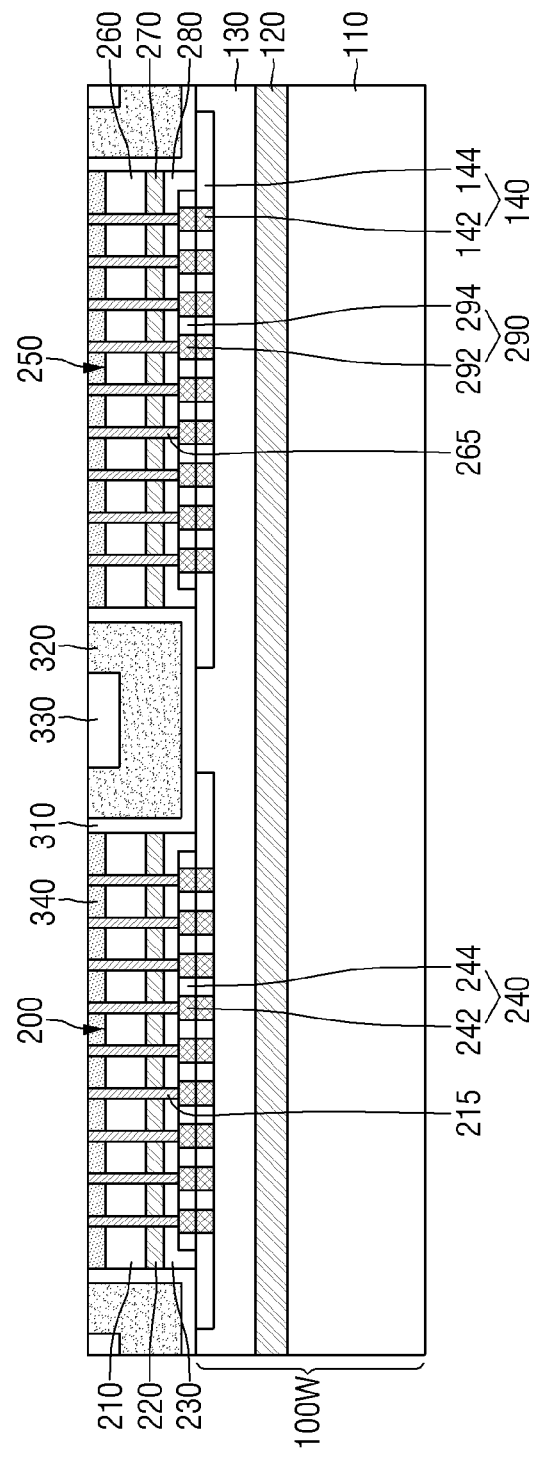

Referring to FIG. 17, the first chip through vias 215 and 265 are exposed.

For example, a second flattening process of exposing the first chip through vias 215 and 265 may be performed. The passivation film 340, the liner film 310, and the multiple gap fill films 320 and 330 formed to be higher than the upper sides of the first chip through vias 215 and 265 may be removed by the second flattening process. Accordingly, the first chip through vias 215 and 265 may penetrate the passivation film 340. The liner film 310 and the multiple gap fill films 320 and 330 formed in the region between the second semiconductor chip 200 and the third semiconductor chip 250 may remain without being removed, by the second flattening process. In some embodiments, the second flattening process may include a chemical mechanical polishing (CMP) process.

In some embodiments, the second silicon oxide film of the passivation film 340 may be removed by the second flattening process. By the second flattening process, the first silicon oxide film and the silicon nitride film of the passivation film 340 may remain without being removed.

Figure 18:
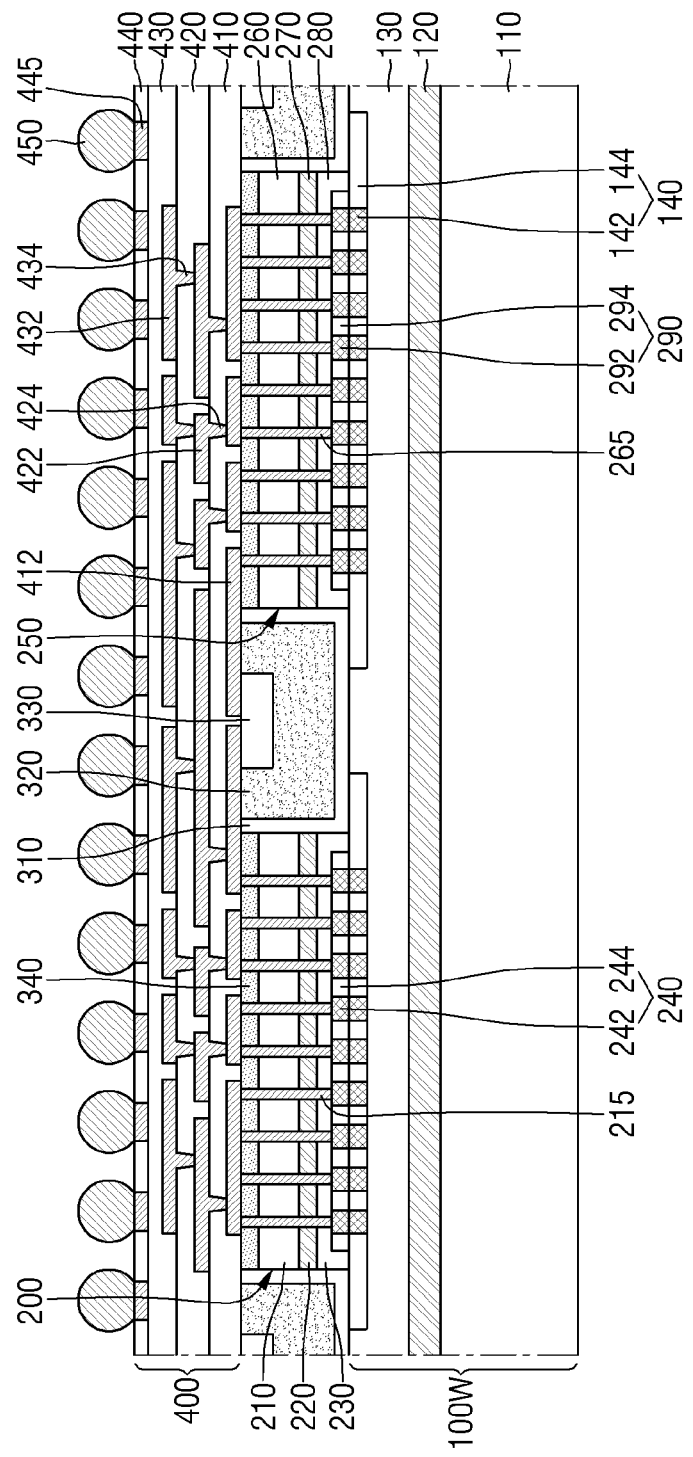

Referring to FIG. 18, a redistribution stack 400 and a plurality of first connection bumps 450 are formed on the passivation film 340 and the multiple gap fill films 320 and 330.

For example, the redistribution stack 400 may extend along the upper side of the passivation film 340, the upper side of the liner film 310, and the upper sides of the multiple gap fill films 320 and 330. The redistribution stack 400 may be electrically connected to the first chip through vias 215 and 265 exposed from the passivation film 340. Accordingly, the wafer 100W, the second semiconductor chip 200 and/or the third semiconductor chip 250 may be electrically connected to the redistribution stack 400.

Subsequently, a plurality of first connection bumps 450 may be formed on the redistribution stack 400. The first connection bumps 450 may each be electrically connected to the redistribution stack 400. Accordingly, the wafer 100W, the second semiconductor chip 200 and/or the third semiconductor chip 250 may be electrically connected to the first connection bumps 450.

Subsequently, a dicing process of cutting the wafer 100W may be performed. In the dicing process, the wafer 100W may be divided into individual semiconductor chips to form the first semiconductor chip 100 described above using FIGS. 1 to 3. Accordingly, the semiconductor package explained above using FIGS. 1 to 3 may be fabricated.

In order to achieve high capacity of the semiconductor package, a plurality of upper chips (for example, the second semiconductor chip 200 and the third semiconductor chip 250) may be stacked on the lower chip (for example, the first semiconductor chip 100) by a C2W (or D2W) method. In such a case, an inorganic multiple gap fill film such as a silicon oxide film may be used to fill the region between the upper chips. However, due to thickness (e.g., about 20 μm or more) of the relatively thick upper chips, there is a limitation in ensuring excellent flatness for subsequent process by the multiple gap fill film alone. For example, in the case of the inorganic multiple gap fill film that fills the region between the relatively thick upper chips, it is eroded in the flattening process such as a chemical mechanical polishing (CMP), and there is a problem of deterioration of flatness.

On the other hand, the semiconductor package according to some embodiments may improve the flatness, by including the multiple gap fill films 320 and 330. Specifically, as described above, the multiple gap fill films 320 and 330 may include the inorganic filling film 320 and the organic filled film 330 that are sequentially stacked between the second semiconductor chip 200 and the third semiconductor chip 250. Since the organic filling film 330 has better gap filling properties than the inorganic filling film 320, the organic filling film 330 may efficiently fill the region between the relatively thick second semiconductor chip 200 and the third semiconductor chip 250. Accordingly, an excellent flatness is ensured for a subsequent process and a semiconductor package having improved process stability and a method for fabricating the same may be provided.

Also, the semiconductor packages according to some embodiments may further improve the flatness by minimizing the use of chemical mechanical polishing (CMP). Specifically, as described above, the multiple gap fill films 320 and 330 except the region between the second semiconductor chip 200 and the third semiconductor chip 250 may be removed by back grinding and then may be flattened using the passivation film 340 to be formed. Accordingly, it is possible to provide a semiconductor package and a method for fabricating the same in which the erosion of the multiple gap fill films 320 and 330 due to chemical mechanical polishing (CMP) is minimized and the process stability is further improved.

Figure 19:
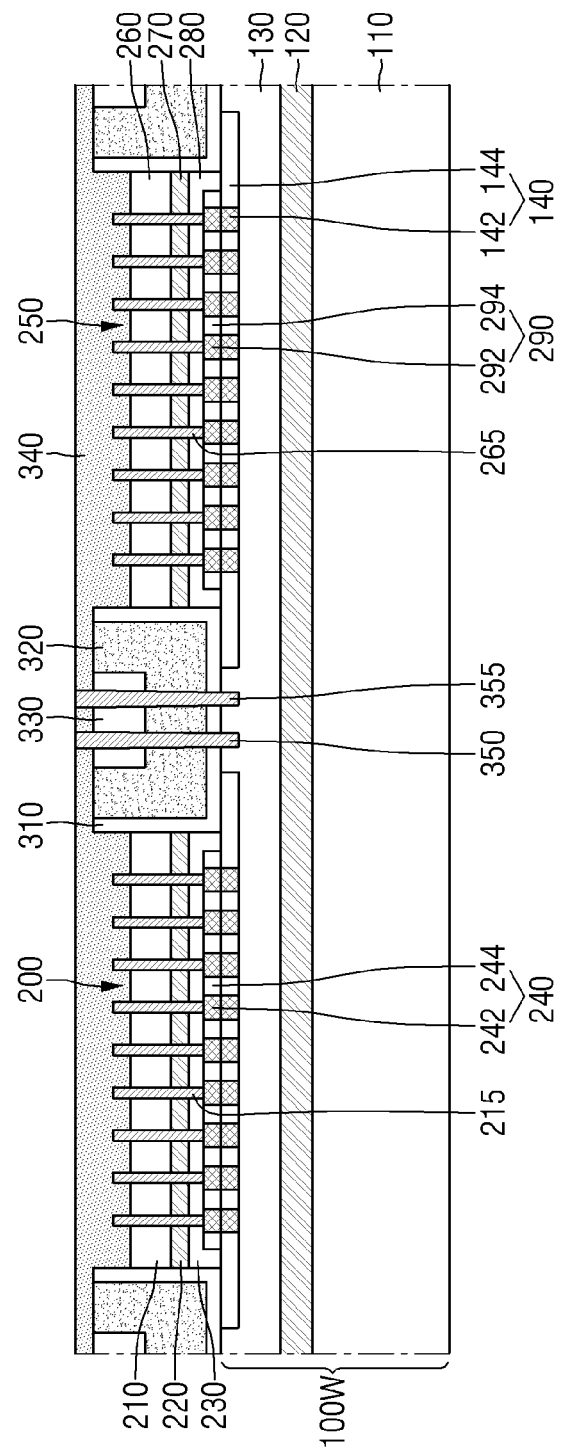
FIG. 19 is an intermediate stage diagram for explaining a method of fabricating a semiconductor package according to some embodiments.

FIG. 19 is an intermediate stage diagram for explaining a method of fabricating a semiconductor package according to some embodiments. For convenience of explanation, repeated parts of contents explained above using FIGS. 1 to 18 will be briefly described or omitted. For reference, FIG. 19 is an intermediate stage diagram for explaining the step after FIG. 15.

Referring to FIG. 19, the passivation film 340 and the gap fill film through vias 350 and 355 are formed.

Since formation of the passivation film 340 is similar to that described above using FIG. 16, detailed description thereof will not be provided below.

The gap fill film through vias 350 and 355 may penetrate the passivation film 340 and the multiple gap fill films 320 and 330 and be connected to the wafer 100W. For example, the gap fill film through vias 350 and 355 may sequentially penetrate the passivation film 340, the organic filling film 330, the inorganic filling film 320 and the liner film 310 and be connected to the first chip wiring layer 130.

In some embodiments, the widths of the gap fill film through vias 350 and 355 may decrease as they go away from the upper side of the passivation film 340. This may be due to the characteristics of the etching process for forming the gap fill film through vias 350 and 355.

Subsequently, processes described above using FIGS. 17 and 18 may be performed. Accordingly, the semiconductor package explained above using FIGS. 4 and 5 may be fabricated.

Figure 20:
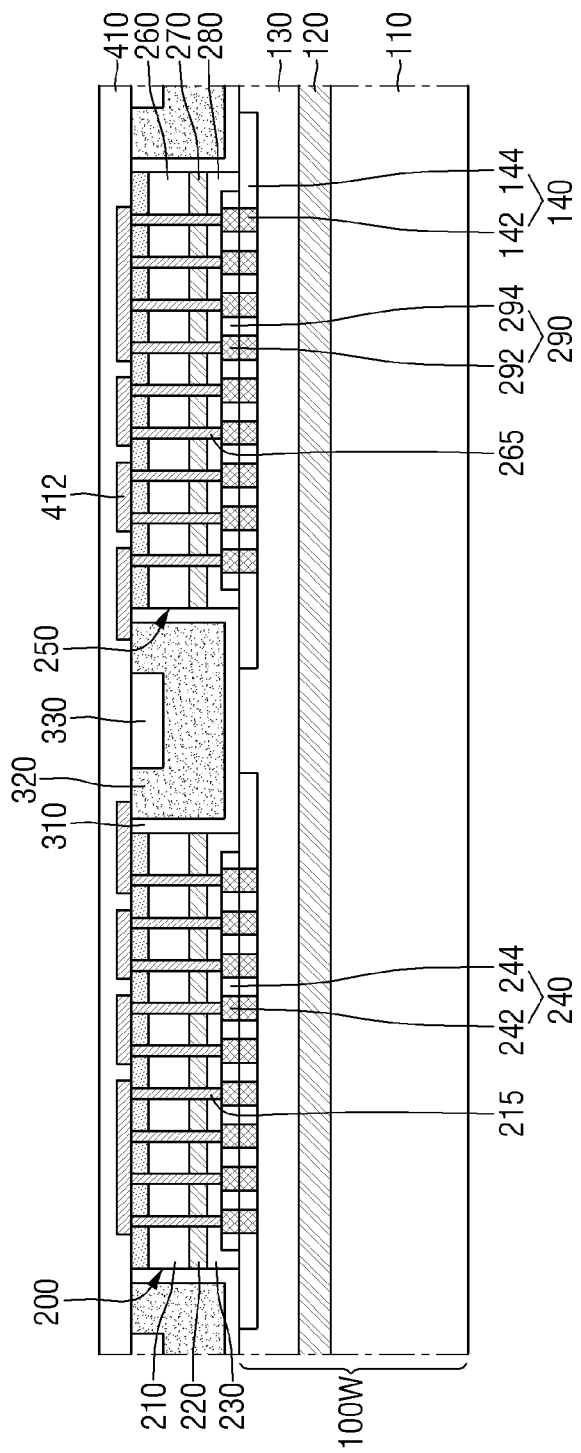
FIGS. 20 and 21 are intermediate stage diagrams for explaining a method for fabricating a semiconductor package according to some embodiments.
Figure 21:
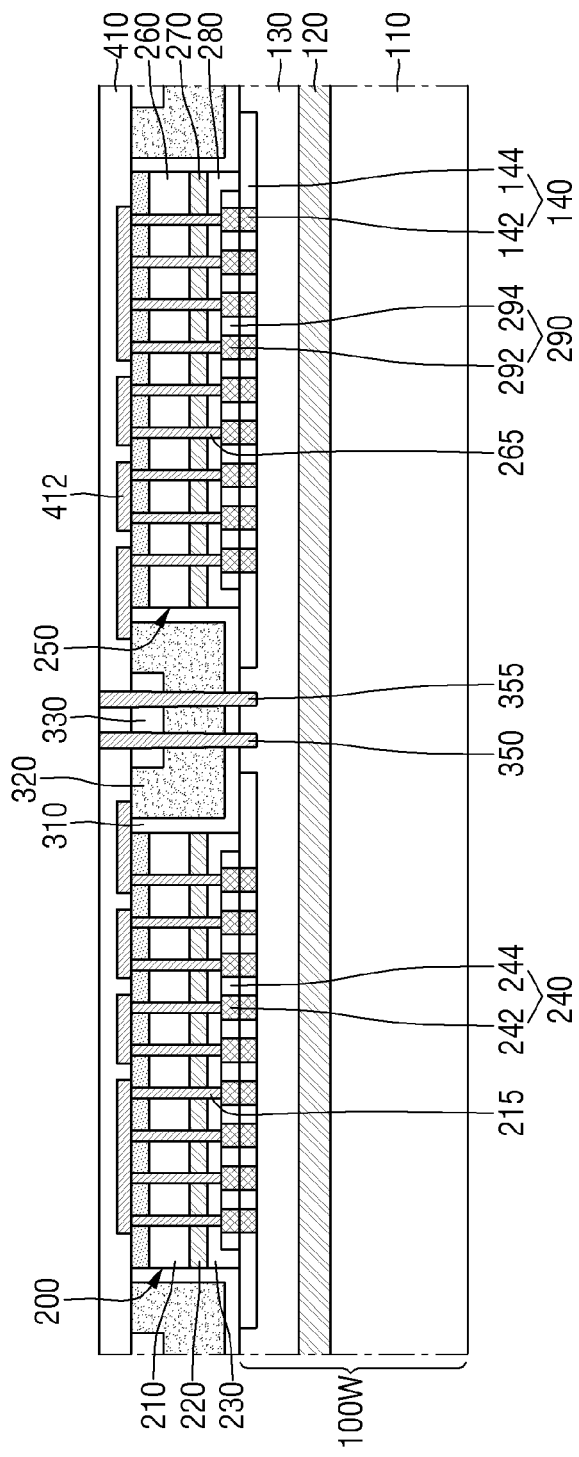

FIGS. 20 and 21 are intermediate stage diagrams for explaining a method for fabricating a semiconductor package according to some embodiments. For convenience of explanation, repeated parts of contents explained above using FIGS. 1 to 18 will be briefly described or omitted. For reference, FIG. 20 is an intermediate stage diagram for explaining the step after FIG. 17.

Referring to FIG. 20, a part of the redistribution stack 400 is formed on the passivation film 340 and the multiple gap fill films 320 and 330.

For example, a first redistribution pattern 412 and a first redistribution insulating film 410 that covers the first redistribution pattern 412 may be formed on the passivation film 340 and the multiple gap fill films 320 and 330. The first redistribution pattern 412 may be electrically connected to the first chip through vias 215 and 265 exposed from the passivation film 340. Accordingly, the wafer 100W, the second semiconductor chip 200 and/or the third semiconductor chip 250 may be electrically connected to the first redistribution pattern 412.

Referring to FIG. 21, gap fill film through vias 350 and 355 are formed.

The gap fill film through vias 350 and 355 may penetrate the first redistribution insulating film 410 and the multiple gap fill films 320 and 330 and be connected to the wafer 100W. For example, the gap fill film through vias 350 and 355 may sequentially penetrate the first redistribution insulating film 410, the organic filling film 330, the inorganic filling film 320 and the liner film 310 and be connected to the first chip wiring layer 130.

In some embodiments, the widths of the gap fill film through vias 350 and 355 may decrease as they go away from the upper side of the first redistribution insulating film 410. This may be due to the characteristics of the etching process for forming the gap fill film through vias 350 and 355.

Subsequently, the steps explained above using FIG. 18 may be performed. Accordingly, the semiconductor package explained above using FIGS. 6 and 7 may be fabricated.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
a first semiconductor chip which includes a first semiconductor substrate, and a first bonding layer on the first semiconductor substrate;
a second semiconductor chip and a third semiconductor chip which are each stacked on the first semiconductor chip and spaced apart from each other;
the second semiconductor chip which includes a second semiconductor substrate, a second bonding layer bonded to the first bonding layer on the second semiconductor substrate, and a chip through via which penetrates the second semiconductor substrate and is connected to the second bonding layer;
a passivation film which extends along upper sides of the second semiconductor chip and the third semiconductor chip and does not extend along side faces of the second semiconductor chip or along side faces of the third semiconductor chip and through which the chip through via penetrates; and
a multiple fill film which extends along an upper side of the first semiconductor chip, the side faces of the second semiconductor chip and the third semiconductor chip, and the side faces of the passivation film, wherein
the multiple fill film includes an inorganic filling film and an organic filling film which are sequentially stacked on the first semiconductor chip,
wherein upper sides of the passivation film, the inorganic filling film, and the organic filling film are along the same plane.

2. The semiconductor package of claim 1, wherein:
the first semiconductor chip further includes a first semiconductor element layer on a front side of the first semiconductor substrate and a first chip wiring layer which connects the first semiconductor element layer and the first bonding layer, and
the second semiconductor chip further includes a second semiconductor element layer on the front side of the second semiconductor substrate opposite to the front side of the first semiconductor substrate and a second chip wiring layer which connects the second semiconductor element layer and the second bonding layer.

3. The semiconductor package of claim 1, wherein:
the first bonding layer includes a first bonding insulating film and a first bonding metal pattern in the first bonding insulating film, and
the second bonding layer includes a second bonding insulating film bonded to the first bonding insulating film and a second bonding metal pattern bonded to the first bonding metal pattern in the second bonding insulating film.

4. The semiconductor package of claim 1, further comprising a liner film extending along the upper side of the first semiconductor chip, the side faces of the second semiconductor chip, and the side faces of the passivation film between the first semiconductor chip and the multiple fill film and between second semiconductor chip and the multiple fill film.

5. The semiconductor package of claim 1, further comprising a redistribution stack which extends along the upper side of the passivation film and the upper side of the multiple fill film and is connected to the chip through via.

6. The semiconductor package of claim 1, wherein the first semiconductor chip and the second semiconductor chip are different types of semiconductor chips from each other.

7. The semiconductor package of claim 6, wherein:
the first semiconductor chip is a logic semiconductor chip, and
the second semiconductor chip is a memory semiconductor chip.

8. A semiconductor package comprising:
a first semiconductor chip which includes a first semiconductor substrate and a first semiconductor element layer on a front side of the first semiconductor substrate;
a second semiconductor chip which includes a second semiconductor substrate, a second semiconductor element layer on a front side of the second semiconductor substrate opposite to the front side of the first semiconductor substrate, and a first chip through via which penetrates the second semiconductor substrate and the second semiconductor element layer;
a third semiconductor chip which includes a third semiconductor substrate, a third semiconductor element layer on a front side of the third semiconductor substrate opposite to the front side of the first semiconductor substrate and a second chip through via which penetrates the third semiconductor substrate and the third semiconductor element layer;

a passivation film which extends along upper sides of the second semiconductor chip and the third semiconductor chip and through which the first and second chip through vias penetrate;

a liner film which extends along an upper side of the first semiconductor chip and side faces of the second semiconductor chip and the third semiconductor chip; and a multiple fill film which includes an inorganic filling film and an organic filling film which are sequentially stacked on the liner film, wherein upper sides of the passivation film, the liner film, the inorganic filling film, and the organic filling film are along the same plane.

9. The semiconductor package of claim 8, wherein the upper sides of the first and second chip through vias and the upper side of the passivation film are placed on the same plane.

10. The semiconductor package of claim 8, further comprising a redistribution stack which extends along the upper side of the passivation film, the upper side of the liner film, and an upper side of the multiple fill film and is connected to the first and second chip through vias.

11. The semiconductor package of claim 8, wherein the inorganic filling film includes at least one of silicon nitride (SiN), silicon oxycarbide (SiCO), and silicon carbonitride (SiCN).

12. The semiconductor package of claim 8, wherein the organic filling film includes at least one of PBO (poly para-phenylene benzo-bisoxazole), BCB (Benzocyclobutene), PI (polyimide), and SOD (spin-on dielectric).

13. The semiconductor package of claim 8, wherein the passivation film includes an oxide film and a nitride film which are sequentially stacked on the second semiconductor chip.

14. A semiconductor package comprising:
a first semiconductor chip which includes a first semiconductor substrate and a first bonding layer on the first semiconductor substrate;
a second semiconductor chip and a third semiconductor chip which are each stacked on the first semiconductor chip and spaced apart from each other;
a passivation film extending along upper sides of each of the second semiconductor chip and the third semiconductor chip;
a multiple fill film which fills a region between the second semiconductor chip and the third semiconductor chip on the first semiconductor chip; and
a redistribution stack extending along an upper side of the passivation film and an upper side of the multiple fill film, wherein:

each of the second semiconductor chip and the third semiconductor chip includes a second semiconductor substrate, a second bonding layer bonded to the first bonding layer on the second semiconductor substrate, and a chip through via which penetrates the second semiconductor substrate and connects the second bonding layer and the redistribution stack, the multiple fill film includes an inorganic filling film and an organic filling film which are sequentially stacked on the first semiconductor chip, and heights of the upper sides of each of the second semiconductor chip and the third semiconductor chip are lower than a height of the upper side of the multiple fill film from the upper side of the first semiconductor chip, and wherein upper sides of the passivation film, the inorganic filling film, and the organic filling film are along the same plane.

15. The semiconductor package of claim 14, wherein:
the first semiconductor chip further includes a first semiconductor element layer on a front side of the first semiconductor substrate, a first chip wiring layer which connects the first semiconductor element layer, and the first bonding layer, each of the second semiconductor chip and the third semiconductor chip further includes a second semiconductor element layer on the front side of the second semiconductor substrate opposite to the front side of the first semiconductor substrate and a second chip wiring layer which connects the second semiconductor element layer and the second bonding layer, and the chip through via connects the second chip wiring layer and the redistribution stack.

16. The semiconductor package of claim 14, wherein the first bonding layer and the second bonding layer are bonded by a metal-oxide hybrid bonding method.

17. The semiconductor package of claim 14, further comprising a fill film through via which penetrates the multiple fill film and connects the first semiconductor chip and the redistribution stack between the second semiconductor chip and the third semiconductor chip.

18. The semiconductor package of claim 17, wherein an upper side of the fill film through via is placed on the same plane as the upper side of the multiple fill film.

19. The semiconductor package of claim 14, further comprising a plurality of solder balls connected to the redistribution stack on upper side of the redistribution stack.

* * * * *